(12) United States Patent
Suzuki et al.

(10) Patent No.: US 9,209,426 B2
(45) Date of Patent: Dec. 8, 2015

(54) LIGHT-EMITTING ELEMENT, DISPLAY MODULE, LIGHTING MODULE, LIGHT-EMITTING DEVICE, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Tsunenori Suzuki, Yokohama (JP); Toshiki Sasaki, Isehara (JP); Riho Kataishi, Isehara (JP); Satoshi Seo, Sagamihara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/453,889

(22) Filed: Aug. 7, 2014

(65) Prior Publication Data
US 2015/0041795 A1    Feb. 12, 2015

(30) Foreign Application Priority Data

Aug. 9, 2013    (JP) ................................ 2013-166870
Dec. 26, 2013    (JP) ................................ 2013-269839

(51) Int. Cl.
*H01L 51/50*    (2006.01)
*H01L 51/52*    (2006.01)
*H01L 51/00*    (2006.01)

(52) U.S. Cl.
CPC ............ *H01L 51/529* (2013.01); *H01L 51/006* (2013.01); *H01L 51/0052* (2013.01); *H01L 51/0054* (2013.01); *H01L 51/0058* (2013.01); *H01L 51/0072* (2013.01);

(Continued)

(58) Field of Classification Search
CPC ..... H01L 23/48; H01L 51/50; H01L 51/5028; H01L 51/0052; H01L 51/0072; H01L 51/0067
USPC ............................... 257/40, 763–766, E23.01
See application file for complete search history.

(56) References Cited

U.S. PATENT DOCUMENTS

| 6,013,384 A | 1/2000 | Kido et al. |
| 6,524,728 B1 | 2/2003 | Kijima et al. |
| 6,821,649 B2 | 11/2004 | Kambe et al. |

(Continued)

FOREIGN PATENT DOCUMENTS

| EP | 2 333 859 A1 | 6/2011 |
| EP | 2 355 199 A1 | 8/2011 |

(Continued)

OTHER PUBLICATIONS

Thompson, M.E., U.S. Appl. No. 60/630,629, filed Nov. 24, 2004.

*Primary Examiner* — Michael Lebentritt
(74) *Attorney, Agent, or Firm* — Husch Blackwell LLP

(57) ABSTRACT

A light-emitting element with improved heat resistance is provided without losing its advantages such as thinness, lightness, and low power consumption. A light-emitting element is provided which includes a first electrode, a second electrode, and an EL layer between the first electrode and the second electrode, in which the EL layer includes a layer containing a condensed aromatic compound or a condensed heteroaromatic compound, and a layer containing 2,9-bis(naphthalen-2-yl)-4,7-diphenyl-1,10-phenanthroline (abbreviation: NBPhen) in contact with the layer containing the condensed aromatic compound or the condensed heteroaromatic compound.

20 Claims, 26 Drawing Sheets

(52) U.S. Cl.
CPC ....... *H01L 51/0073* (2013.01); *H01L 51/0074* (2013.01); *H01L 51/0085* (2013.01); *H01L 51/5016* (2013.01)

(56) References Cited

U.S. PATENT DOCUMENTS

| | | | |
|---|---|---|---|
| 6,972,334 | B1 | 12/2005 | Shibanuma et al. |
| 7,018,724 | B2 | 3/2006 | Kambe et al. |
| 2002/0139986 | A1 | 10/2002 | Okada et al. |
| 2003/0189401 | A1 | 10/2003 | Kido et al. |
| 2004/0027061 | A1 | 2/2004 | Seo et al. |
| 2004/0100189 | A1 | 5/2004 | Adachi et al. |
| 2005/0151466 | A1 | 7/2005 | Liao et al. |
| 2005/0221124 | A1 | 10/2005 | Hwang et al. |
| 2006/0138453 | A1 | 6/2006 | Thompson et al. |
| 2006/0154554 | A1 | 7/2006 | Nomura et al. |
| 2007/0037983 | A1 | 2/2007 | Nomura et al. |
| 2010/0102450 | A1* | 4/2010 | Narayan ........................ 257/763 |
| 2011/0210316 | A1 | 9/2011 | Kadoma et al. |
| 2012/0007063 | A1 | 1/2012 | Langer et al. |
| 2012/0091923 | A1* | 4/2012 | Kastner-Jung et al. ........ 315/360 |
| 2012/0211082 | A1* | 8/2012 | Akiyama et al. ............... 136/263 |
| 2013/0020561 | A1 | 1/2013 | Suzuki et al. |
| 2014/0339524 | A1* | 11/2014 | Shitagaki et al. ............... 257/40 |
| 2015/0041792 | A1 | 2/2015 | Suzuki et al. |

FOREIGN PATENT DOCUMENTS

| | | |
|---|---|---|
| JP | 07-082551 A | 3/1995 |
| JP | 09-063771 A | 3/1997 |
| JP | 10-340781 A | 12/1998 |
| JP | 11-307264 A | 11/1999 |
| JP | 2001-267080 A | 9/2001 |
| JP | 2004-175691 A | 6/2004 |
| JP | 2004-303489 A | 10/2004 |
| JP | 2005-108720 A | 4/2005 |

* cited by examiner

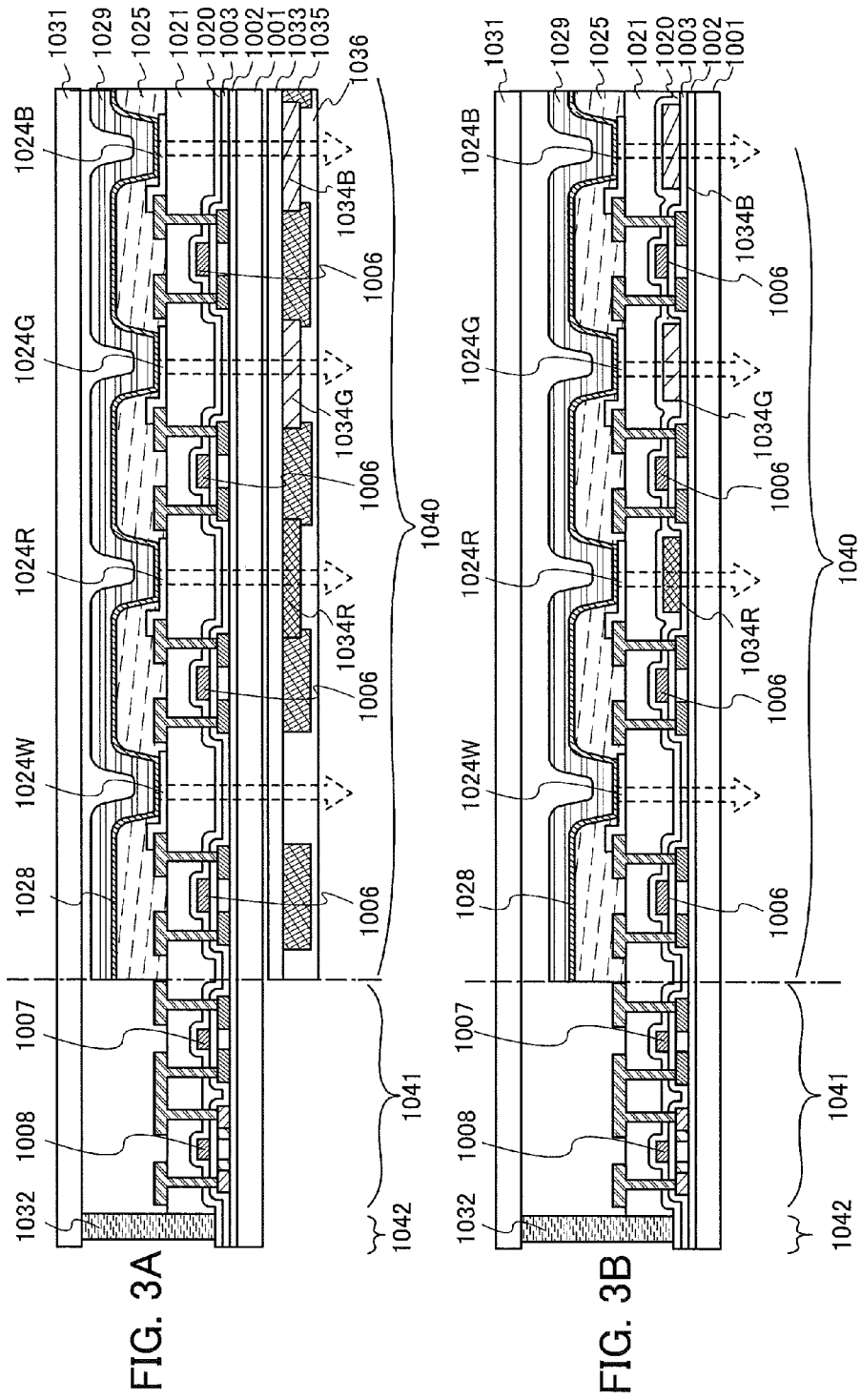

FIG. 7A
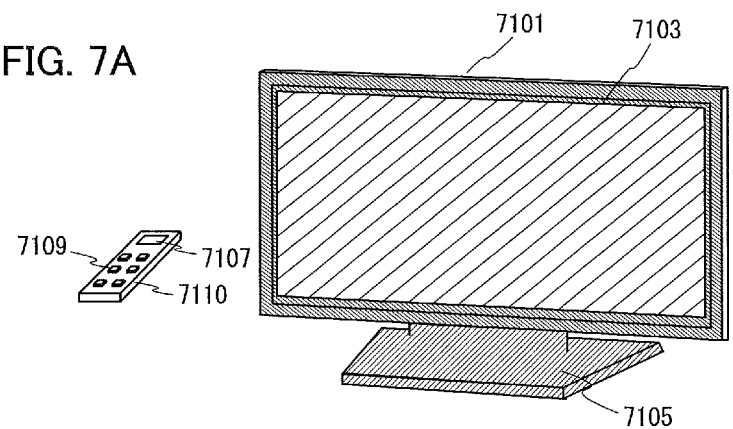
FIG. 7B1
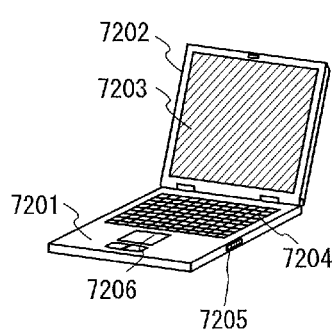
FIG. 7B2
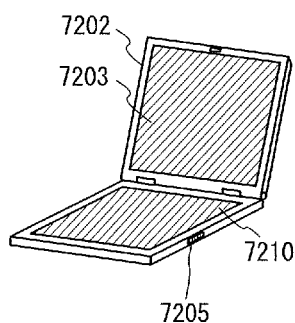
FIG. 7C
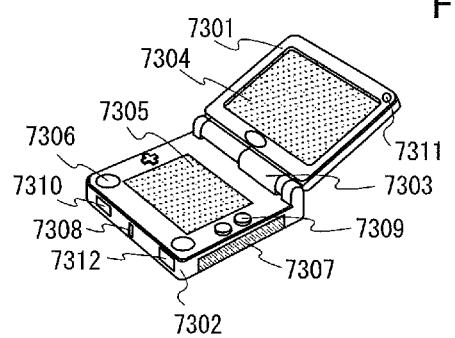
FIG. 7D
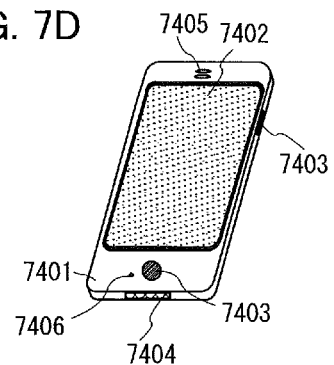

LIGHT-EMITTING ELEMENT, DISPLAY MODULE, LIGHTING MODULE, LIGHT-EMITTING DEVICE, DISPLAY DEVICE, ELECTRONIC DEVICE, AND LIGHTING DEVICE

BACKGROUND OF THE INVENTION

1. Field of the Invention

The present invention relates to an object, a method, or a manufacturing method. In addition, the present invention relates to a process, a machine, manufacture, and a composition of matter. One embodiment of the present invention particularly relates to a semiconductor device, a display device, a light-emitting device, a driving method thereof, and a manufacturing method thereof. One embodiment of the present invention particularly relates to a light-emitting element, a display module, a lighting module, a display device, a light-emitting device, an electronic device, and a lighting device in which an organic compound is used as a light-emitting substance.

2. Description of the Related Art

In recent years, research and development of a light-emitting element (organic EL element) which uses an organic compound and utilizes electroluminescence (EL) have been actively promoted. In the basic structure of such a light-emitting element, an organic compound layer containing a light-emitting substance (an EL layer) is provided between a pair of electrodes. By voltage application to this element, light emission from the light-emitting substance can be obtained.

Since such a light-emitting element is of self-light-emitting type, it is considered that the light-emitting element has advantages over a liquid crystal display, such as high visibility of pixels and no need of backlight, and is therefore suitable as a flat panel display element. A display including such a light-emitting element is also highly advantageous in that it can be thin and lightweight. Besides, very high speed response is one of the features of such an element.

Furthermore, an organic EL element can provide planar light emission. Thus, a large-area element can be easily formed. This feature is difficult to obtain with point light sources typified by incandescent lamps and LEDs or linear light sources typified by fluorescent lamps. Thus, the light-emitting element also has great potential as a planar light source which can be applied to a lighting device and the like.

A display or a lighting device including an organic EL element having such features is applied to a variety of electronic devices and used in a variety of environments. For example, a display of an in-vehicle navigation system or the like is constantly located in a car; a dashboard of a sun-heated car in summer often reaches a temperature as high as or higher than 80° C. Since the above-described light-emitting element is formed by stacking layers of a variety of organic compounds, it may deteriorate and become inoperative when placed in a high temperature environment.

There is a demand for a highly heat resistant light-emitting element with reduced deterioration of characteristics even after it is placed in a high temperature environment as described above (see Patent Documents 1, for example).

PATENT DOCUMENT

[Patent Document 1] Japanese Published Patent Application No. H10-340781

SUMMARY OF THE INVENTION

Therefore, it is an object of an embodiment of the present invention to provide a light-emitting element with improved heat resistance.

It is an object of another embodiment of the present invention to provide a light-emitting element with improved heat resistance without losing its advantages such as thinness, lightness, and low power consumption. It is an object of another embodiment of the present invention to provide a novel light-emitting element.

It is an object of another embodiment of the present invention to provide a display module, a lighting module, a light-emitting device, a display device, an electronic device, and a lighting device with excellent heat resistance by using the above light-emitting element.

It is an object of another embodiment of the present invention to provide a display module, a lighting module, a light-emitting device, a display device, an electronic device, and a lighting device with excellent heat resistance by using the above light-emitting element without losing its advantages such as thinness, lightness, and low power consumption.

It is only necessary that at least one of the above-described objects be achieved in the present invention.

One embodiment of the present invention is a light-emitting element which includes a first electrode, a second electrode, and an EL layer between the first electrode and the second electrode. The EL layer includes a layer containing a condensed aromatic compound or a condensed heteroaromatic compound, and a layer containing 2,9-bis(naphthalen-2-yl)-4,7-diphenyl-1,10-phenanthroline (abbreviation: NBPhen) in contact with the layer containing the condensed aromatic compound or the condensed heteroaromatic compound.

One embodiment of the present invention is a light-emitting element which includes a first electrode, a second electrode, and an EL layer between the first electrode and the second electrode. The EL layer includes a layer containing a condensed aromatic compound or a condensed heteroaromatic compound having a condensed ring skeleton including three or more rings, and a layer containing NBPhen in contact with the layer containing the condensed aromatic compound or the condensed heteroaromatic compound.

Another embodiment of the present invention is a light-emitting element having the above structure, in which the layer containing the condensed aromatic compound or the condensed heteroaromatic compound contains the condensed heteroaromatic compound.

Another embodiment of the present invention is a light-emitting element having the above structure, in which the condensed heteroaromatic compound includes two nitrogen atoms in one condensed ring skeleton.

Another embodiment of the present invention is a light-emitting element having the above structure and emitting phosphorescent light.

Another embodiment of the present invention is a light-emitting element having the above structure, in which the layer containing the condensed heteroaromatic compound further contains iridium.

Another embodiment of the present invention is a light-emitting element having the above structure, in which iridium is contained in a portion of the layer containing the condensed heteroaromatic compound and is not contained in a region in contact with the layer containing NBPhen.

An embodiment of the present invention is a display module including any of the above light-emitting elements.

An embodiment of the present invention is a lighting module including any of the above light-emitting elements.

An embodiment of the present invention is a light-emitting device including any of the above light-emitting elements and a unit for controlling the light-emitting element.

An embodiment of the present invention is a display device including any of the above light-emitting elements in a display portion and a unit for controlling the light-emitting element.

An embodiment of the present invention is a lighting device including any of the above light-emitting elements in a lighting portion and a unit for controlling the light-emitting element.

An embodiment of the present invention is an electronic device including any of the above light-emitting elements.

Note that the light-emitting device in this specification includes, in its category, an image display device with a light-emitting element. In addition, the light-emitting device includes all the following modules: a module in which a connector, such as an anisotropic conductive film or a tape carrier package (TCP), is attached to a light-emitting device; a module in which a printed wiring board is provided at the end of a TCP; and a module in which an integrated circuit (IC) is directly mounted on a light-emitting device by a chip-on-glass (COG) method. Furthermore, light-emitting devices that are used in lighting equipment and the like shall also be included.

One embodiment of the present invention can provide a light-emitting element with improved heat resistance.

Another embodiment of the present invention can provide a light-emitting element with improved heat resistance without losing its advantages such as thinness, lightness, and low power consumption.

Another embodiment of the present invention can provide a display module, a lighting module, a light-emitting device, a display device, an electronic device, and a lighting device with excellent heat resistance by using the above-described light-emitting element.

Another embodiment of the present invention can provide a display module, a lighting module, a light-emitting device, a display device, an electronic device, and a lighting device with excellent heat resistance by using the above-described light-emitting element without losing its advantages such as thinness, lightness, and low power consumption.

BRIEF DESCRIPTION OF THE DRAWINGS

FIGS. 3A and 3B are schematic diagrams of active matrix light-emitting devices.

FIGS. 7A, 7B1, 7B2, 7C, and 7D illustrate electronic devices.

DETAILED DESCRIPTION OF THE INVENTION

Embodiments of the present invention will be described below with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Embodiment 1

The heat resistance of a light-emitting element is known to greatly depend on the heat resistance of a material used (e.g., Tg or thermal decomposition temperature), but other factors have not been examined so much. The present inventors found out that a stacked-layer structure of a light-emitting element also affects heat resistance, and invented a light-emitting element with improved heat resistance compared with those of conventional ones, in which a layer containing NBPhen and a layer containing a condensed aromatic compound or a condensed heteroaromatic compound are stacked as an electron-transport layer.

Figure 1A:
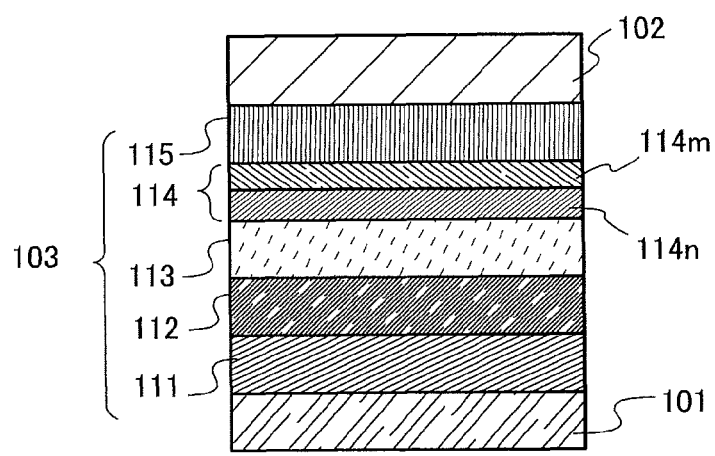
FIGS. 1A and 1B are schematic diagrams of light-emitting elements.

FIG. 1A illustrates a schematic diagram of a light-emitting element of one embodiment of the present invention. The light-emitting element has at least a pair of electrodes (a first electrode 101 and a second electrode 102) and an EL layer 103 including a layer 114n containing a condensed aromatic compound or a condensed heteroaromatic compound and a layer 114m containing NBPhen in contact with the layer 114n containing the condensed aromatic compound or the condensed heteroaromatic compound.

FIG. 1A also illustrates a hole-injection layer 111, a hole-transport layer 112, a light-emitting layer 113, and an electron-injection layer 115 in the EL layer 103. However, this stacked-layer structure is an example, and the structure of the EL layer 103 in the light-emitting element of one embodiment of the present invention is not limited thereto. Note that in FIG. 1A, the first electrode 101 functions as an anode, and the second electrode 102 functions as a cathode.

In the light-emitting element of this embodiment, the layer 114m containing NBPhen is in contact with the layer 114n containing the condensed aromatic compound or the condensed heteroaromatic compound. Since the layer 114m containing NBPhen has an electron-transport property, it is preferably provided closer to the cathode than a light-emitting region is. The layer 114m containing NBPhen may be in contact with the electron-injection layer 115 or the second electrode 102 on the side opposite to the side in contact with the layer 114n containing the condensed aromatic compound or the condensed heteroaromatic compound.

The condensed aromatic compound or the condensed heteroaromatic compound is preferably a compound having a condensed ring skeleton including three or more rings. This is because the interface between NBPhen and the compound having the condensed ring skeleton including three or more rings is thermally and electrically very stable.

The light-emitting element having this structure of one embodiment of the present invention shows a small decrease in luminance even when kept in an environment at high temperature (e.g., 85° C. or higher). In the case where the layer 114n containing the condensed aromatic compound or the condensed heteroaromatic compound contains the condensed heteroaromatic compound, a change in drive voltage can also be reduced.

In the case where the layer 114n containing the condensed aromatic compound or the condensed heteroaromatic compound contains the condensed heteroaromatic compound, the condensed heteroaromatic compound preferably includes two nitrogen atoms in one condensed ring skeleton because this enables the light-emitting element to have high reliability and also contributes to a decrease in drive voltage.

The condensed heteroaromatic compound is suitable as a host material for a phosphorescent light-emitting substance or as a material of an electron-transport layer adjacent to a phosphorescent light-emitting layer; therefore, the light-emitting element is preferably a light-emitting element which emits phosphorescent light. A phosphorescent light-emitting element having the above structure can have high reliability with improved heat resistance, and can have both high reliability and high emission efficiency due to the use of phosphorescent light emission.

Examples of compounds which can be suitably used as the condensed aromatic compound or the condensed heteroaromatic compound include the following. Suitable examples of the condensed aromatic compound include compounds having condensed ring skeletons each including three or more rings, e.g., anthracene compounds such as 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA) and tetracene compounds such as 5,12-bis(2,4-diphenylphenyl)tetracene. Among these compounds, anthracene compounds are particularly preferable because a light-emitting element with long lifetime can be easily obtained. Examples of the condensed heteroaromatic compound include heterocyclic compounds having polyazole skeletons, such as 2-[3-(dibenzothiophen-4-yl)phenyl]-1-phenyl-1H-benzimidazole (abbreviation: mDBTBIm-II); condensed heterocyclic compounds including three or more rings having diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), and 2-[3'-(9H-carbazol-9-yl)biphenyl-3-yl]dibenzo[f,h]quinoxaline (abbreviation: 2mCzBPDBq); and condensed heterocyclic compounds having pyridine skeletons, such as 2-[3-(dibenzothiophen-4-yl)phenyl]dibenzo[f,h]quinoline (abbreviation: 2mDBTPDBqu-II) and 2-{3-[3-(dibenzothiophen-4-yl)phenyl]phenyl}dibenzo[f,h]quinoline (abbreviation: 2mDBTBPDBqu-II). Among the above compounds, heterocyclic compounds having diazine skeletons and heterocyclic compounds having pyridine skeletons have high reliability and are thus preferable. Heterocyclic compounds having diazine (pyrimidine or pyrazine) skeletons have a high electron-transport property and contribute to a decrease in drive voltage; thus, among the above compounds, dibenzoquinoxaline derivatives such as 2mDBTPDBq-II, 2mDBTBPDBq-II, and 2mCzBPDBq are particularly suitable.

Embodiment 2

In this embodiment, a detailed example of the structure of the light-emitting element described in Embodiment 1 will be described below with reference to FIG. 1A.

The light-emitting element in this embodiment includes, between the pair of electrodes, the EL layer including a plurality of layers. In this embodiment, the light-emitting element includes the first electrode 101, the second electrode 102, and the EL layer 103 which is provided between the first electrode 101 and the second electrode 102. Note that the following description is made on the assumption that the first electrode 101 functions as an anode and that the second electrode 102 functions as a cathode.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specifically, for example, indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like can be given. Films of these electrically conductive metal oxides are usually formed by a sputtering method but may be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), nitrides of metal materials (e.g., titanium nitride), and the like can be given. Graphene can also be used. Note that when a composite material described later is used for a layer which is in contact with the first electrode 101 in the EL layer 103, an electrode material can be selected regardless of its work function.

There is no particular limitation on the stacked-layer structure of the EL layer 103 as long as the EL layer 103 has the structure described in Embodiment 1. For example, the EL layer 103 can be formed by combining a hole-injection layer, a hole-transport layer, a light-emitting layer, an electron-transport layer, an electron-injection layer, a carrier-blocking layer, an intermediate layer, and the like as appropriate. In this embodiment, the EL layer 103 has a structure in which the hole-injection layer 111, the hole-transport layer 112, the light-emitting layer 113, an electron-transport layer 114, and the electron-injection layer 115 are stacked in this order over the first electrode 101. Among these layers, the electron-transport layer 114 has a structure in which the layer 114n containing the condensed aromatic compound or the condensed heteroaromatic compound and the layer 114m containing NBPhen are stacked. Specific examples of materials used for each layer are given below.

The hole-injection layer 111 contains a substance with a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: H$_2$Pc) and copper phthalocyanine (CuPc), an aromatic amine compound such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD), or a high molecular compound such as poly(3,4-ethylenedioxythiophene)/poly(styrenesulfonic acid) (PEDOT/PSS).

Alternatively, a composite material in which a substance having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can also be used for the first electrode 101. As the substance having an acceptor property, 7,7,8,8-tetracyano-2,3,5,6-tetrafluoroquinodimethane (abbreviation: F$_4$-TCNQ), chloranil, and the like can be given. In addition, transition metal oxides can be given. Oxides of the metals that belong to Groups 4 to 8 of the periodic table can be given. Specifically, vanadium oxide, niobium oxide, tantalum oxide, chromium oxide, molybdenum oxide, tungsten oxide, manganese oxide, and rhenium oxide are preferable in that their electron-accepting property is high. Among these oxides, molybdenum oxide is particularly preferable in that it is stable in the air, has a low hygroscopic property, and is easy to handle.

As the substance having a hole-transport property which is used for the composite material, any of a variety of organic compounds such as aromatic amine compounds, carbazole derivatives, aromatic hydrocarbons, and high molecular compounds (e.g., oligomers, dendrimers, or polymers) can be used. Organic compounds that can be used as the substance having a hole-transport property in the composite material are specifically given below.

Examples of the aromatic amine compounds are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of carbazole derivatives that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of carbazole derivatives that can be used for the composite material are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, and the like.

Examples of aromatic hydrocarbons that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, and the like can also be used. The aromatic hydrocarbon which has a hole mobility of $1 \times 10^{-6}$ cm$^2$/Vs or more and which has 14 to 42 carbon atoms is particularly preferable.

Note that the aromatic hydrocarbons that can be used for the composite material may have a vinyl skeleton. Examples of the aromatic hydrocarbon having a vinyl group are 4,4'-bis(2,2-diphenylvinyl)biphenyl (abbreviation: DPVBi) and 9,10-bis[4-(2,2-diphenylvinyl)phenyl]anthracene (abbreviation: DPVPA).

A high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide]

(abbreviation: PTPDMA), and poly[N,N'-bis(4-butylphenyl)-N,N'-bis(phenyl)benzidine] (abbreviation: poly-TPD) can also be used.

By providing a hole-injection layer, a high hole-injection property can be achieved to allow a light-emitting element to be driven at a low voltage.

The hole-transport layer 112 contains a substance having a hole-transport property. Examples of the substance having a hole-transport property are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and 4-phenyl-4'-(9-phenylfluoren-9-yl)triphenylamine (abbreviation: BPAFLP). The substances mentioned here have high hole-transport properties and are mainly ones that have a hole mobility of $10^{-6}$ cm$^2$/Vs or more. An organic compound given as an example of the substance having a hole-transport property in the composite material described above can also be used for the hole-transport layer 112. A high molecular compound such as poly(N-vinylcarbazole) (abbreviation: PVK) and poly(-vinyltriphenylamine) (abbreviation: PVTPA) can also be used. Note that the layer that contains a substance having a hole-transport property is not limited to a single layer, and may be a stack of two or more layers including any of the above substances.

The light-emitting layer 113 may be a layer emitting fluorescent light, a layer emitting phosphorescent light, or a layer emitting thermally activated delayed fluorescent (TADF) light. Furthermore, the light-emitting layer 113 may be a single layer or include a plurality of layers containing different light-emitting substances.

Examples of a material which can be used as a fluorescent light-emitting substance in the light-emitting layer 113 are as follows. Other various fluorescent light-emitting substances can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9-phenyl-9H-fluoren-9-yl)phenyl]-N,N'-diphenyl-pyrene-1,6-diamine (abbreviation: 1,6FLPAPrn), N,N'-bis(3-methylphenyl)-N,N'-bis[3-(9-phenyl-9H-fluoren-9-yl)phenyl]-pyrene-1,6-diamine (abbreviation: 1,6mMemFLPAPm), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). Condensed aromatic diamine compounds typified by pyrenediamine compounds such as 1,6FLPAPrn and 1,6mMemFLPAPm are particularly preferable because of their high hole-trapping properties, high emission efficiency, and high reliability.

Preferable examples of host materials in which the fluorescent light-emitting substance is dispersed are as follows.

The examples include anthracene compounds such as 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). The use of a substance having an anthracene skeleton as the host material makes it possible to obtain a light-emitting layer with high emission efficiency and high durability. In particular, CzPA, cgDBCzPA, 2mBnfPPA, and PCzPA are preferable choices because of their excellent characteristics.

Examples of a material which can be used as a phosphorescent light-emitting substance in the light-emitting layer 113 are as follows.

The examples include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), and tris[4-(3-biphenyl)-5-isopropyl-3-phenyl-4H-1,2,4-triazolato]iridium(III) (abbreviation: Ir(iPrptz-3b)$_3$); organometallic iridium complexes having 1H-triazole skeletons, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having imidazole skeletons, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). These are compounds emitting blue phosphorescent light and have an emission peak at 440 nm to 520 nm.

Other examples include organometallic iridium complexes having pyrimidine skeletons, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), bis[2-(6-tert-butyl-4-pyrimidinyl-κN3)phenyl-κC](2,4-pentanedionato-κ$^2$O,O')iridium(III) (abbreviation: Ir(tBuppm)$_2$(acac)), (acetylacetonato)bis[4-(2-norbornyl)-6-phenylpyrimidinato]iridium(III) (endo- and exo-mixture) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), and (acetylacetonato)bis(4,6-diphenylpyrimidinato)iridium(III) (abbreviation: Ir(dppm)$_2$(acac)); organometallic iridium complexes having pyrazine skeletons, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having pyridine skeletons, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); and rare earth metal complexes such as tris(acetylacetonato)(monophenanthroline)terbium(III) (abbreviation: Tb(acac)$_3$(Phen)). These are mainly compounds emitting green phosphorescent light and have an emission peak at 500 nm to 600 nm. Note that organometallic iridium complexes having pyrimidine skeletons have distinctively high reliability and emission efficiency and thus are especially preferable.

Other examples include organometallic iridium complexes having pyrimidine skeletons, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm), bis[4,6-di(naphthalen-1-yl)pyrimidinato](dipivaloylmethanato)iridium(III) (abbreviation: Ir(d1npm)$_2$(dpm)); organometallic iridium complexes having pyrazine skeletons, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), and (acetylacetonato)bis[2,3-bis(4-fluorophenyl)quinoxalinato] iridium(III) (abbreviation: Ir(Fdpq)$_2$(acac)); organometallic iridium complexes having pyridine skeletons, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); platinum complexes such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). These are compounds emitting red phosphorescent light and have an emission peak at 600 nm to 700 nm. Further, organometallic iridium complexes having pyrazine skeletons can provide red light emission with favorable chromaticity.

As well as the above phosphorescent compounds, a variety of phosphorescent light-emitting substances may be selected and used.

Examples of TADF materials are as follows.

The examples include a fullerene, a derivative thereof, an acridine derivative such as proflavine, eosin, or the like, and a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$(OEP)), which are shown in the following structural formulae.

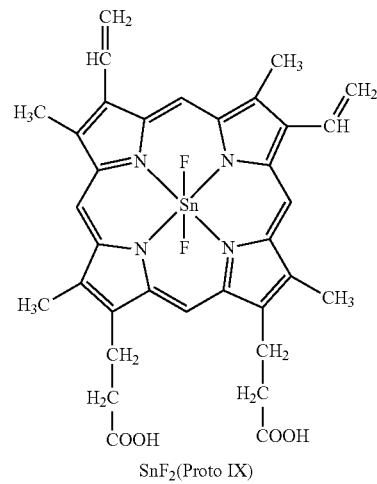

SnF$_2$(Proto IX)

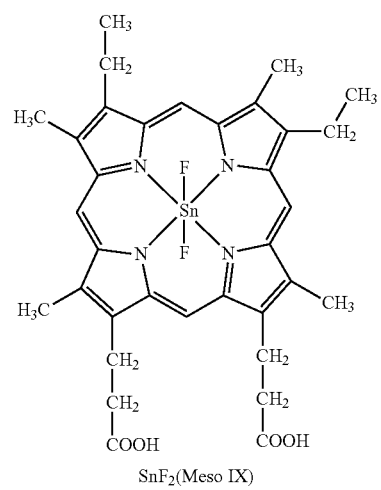

SnF$_2$(Meso IX)

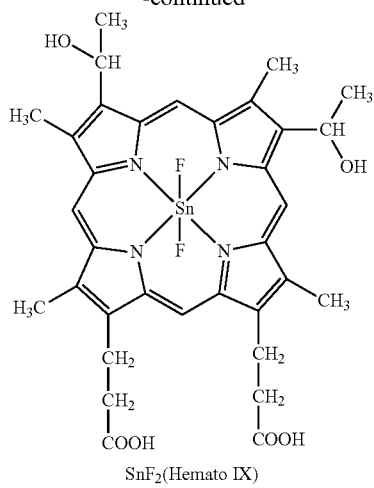

SnF₂(Hemato IX)

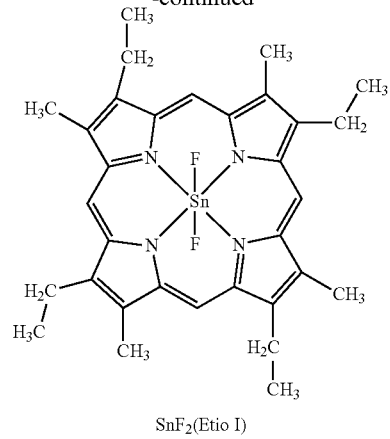

SnF₂(Etio I)

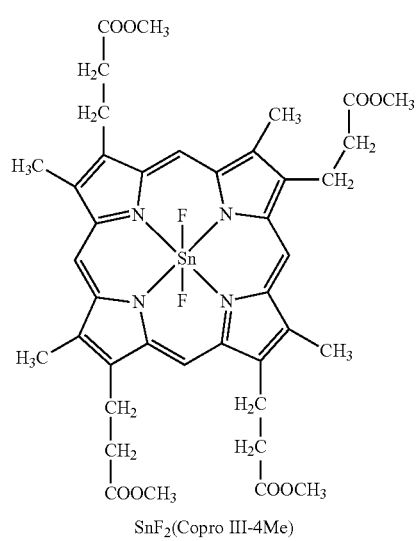

SnF₂(Copro III-4Me)

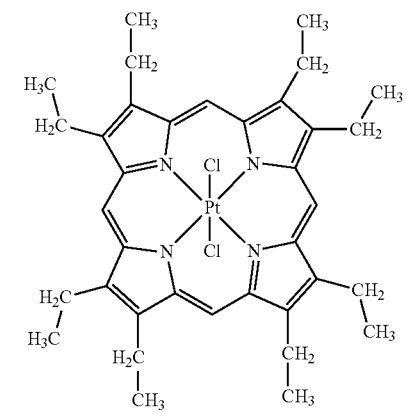

PtCl₂OEP

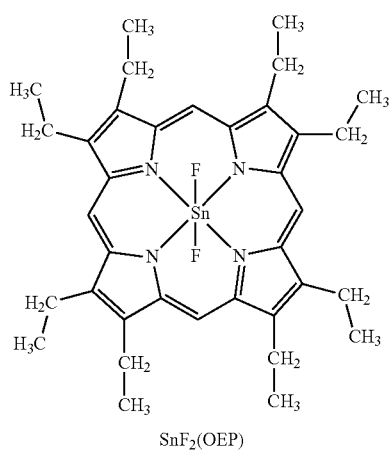

SnF₂(OEP)

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ) shown in the following structural formula, can be used. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the energy difference between the $S_1$ level and the $T_1$ level becomes small.

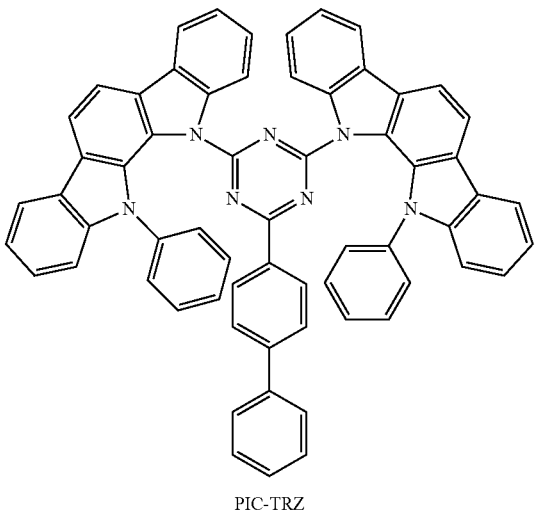 [SMILES: c1ccc(-c2ccc(-c3nc(-n4c5ccccc5c5ccc6c7ccccc7n(-c7ccccc7)c6c54)nc(-n4c5ccccc5c5ccc6c7ccccc7n(-c7ccccc7)c6c54)n3)cc2)cc1]

PIC-TRZ

Examples of host materials in which the above-described phosphorescent light-emitting substance or TADF material is dispersed are as follows.

The following are examples of materials having an electron-transport property: metal complexes such as bis(10-hydroxybenzo[h]quinolinato)beryllium(II) (abbreviation: BeBq$_2$), bis(2-methyl-8-quinolinolato) (4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and heterocyclic compounds having pyridine skeletons, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Heterocyclic compounds having diazine (pyrimidine or pyrazine) skeletons have a high electron-transport property and contribute to a decrease in drive voltage.

The following are examples of materials having a hole-transport property: compounds having aromatic amine skeletons, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having carbazole skeletons, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having thiophene skeletons, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having furan skeletons, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, compounds having aromatic amine skeletons and compounds having carbazole skeletons are preferable because these compounds are highly reliable and have high hole-transport properties to contribute to a reduction in drive voltage.

Carrier-transport materials can be selected from a variety of substances as well as from the carrier-transport materials given above. Note that the host material may be a mixture of a plurality of kinds of substances, and in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The ratio of the content of the material having a hole-transport property to the content of the material having an electron-transport property may be 1:9 to 9:1. An exciplex may be formed by these mixed materials. It is preferable that the combination of these materials be selected so as to form an exciplex which exhibits light emission whose wavelength overlaps with a wavelength of a lowest-energy-side absorption band of the phosphorescent light-emitting substance or TADF material.

The light-emitting layer 113 having the above-described structure can be formed by co-evaporation by a vacuum evaporation method, or an inkjet method, a spin coating method, a dip coating method, or the like using a mixed solution.

The electron-transport layer 114 contains a substance having an electron-transport property. In this embodiment, the electron-transport layer 114 has a structure in which the layer 114*n* containing the condensed aromatic compound or the condensed heteroaromatic compound and the layer 114*m* containing NBPhen are stacked. Since details of these layers are described in Embodiment 1, repetition of description may be omitted. Note that as these two layers, the layer 114*n* containing the condensed aromatic compound or the condensed heteroaromatic compound is formed on the light-emitting layer 113 side and the layer 114*m* containing NBPhen is formed on the second electrode 102 side. Furthermore, a different layer containing a substance having an electron-transport property may be provided between the layer 114n containing the condensed aromatic compound or the condensed heteroaromatic compound and the light-emitting layer 113.

It is preferable that the condensed aromatic compound or the condensed heteroaromatic compound contained in the layer 114n be used as a host material in the light-emitting layer. Such a structure lowers a barrier to electron injection from the electron-transport layer 114 to the light-emitting layer 113 and therefore can decrease a drive voltage of the light-emitting element. In this case, a light-emitting region can be regarded as being formed in the layer 114n containing the condensed aromatic compound or the condensed heteroaromatic compound, and it can also be said that the layer 114n containing the condensed aromatic compound or the condensed heteroaromatic compound contains a phosphorescent light-emitting substance (typically an iridium complex). In other words, in this structure, the layer containing NBPhen is in contact with the layer containing the condensed aromatic compound or the condensed heteroaromatic compound, and the layer containing the condensed aromatic compound or the condensed heteroaromatic compound further contains iridium.

Alternatively, it is also possible that the layer 114n containing the condensed aromatic compound or the condensed heteroaromatic compound does not contain iridium. In such a case, the carrier-trapping properties of the phosphorescent light-emitting substance (iridium complex) do not work on the layer 114n containing the condensed aromatic compound or the condensed heteroaromatic compound, and the light-emitting layer 113 and the layer 114n containing the condensed aromatic compound or the condensed heteroaromatic compound contain the same condensed aromatic compound or condensed heteroaromatic compound. Therefore, the effect of decreasing a drive voltage is most noticeable. However, in such a case where the layer 114n containing the condensed aromatic compound or the condensed heteroaromatic compound does not contain iridium, the interface between the layer 114n and a layer stacked thereover conventionally tends to have a problem with heat resistance. However, in the case where a layer containing NBPhen is stacked over the layer 114n containing the condensed aromatic compound or the condensed heteroaromatic compound as in the present invention, this problem can be solved without losing the effect of decreasing a drive voltage.

Between the electron-transport layer 114 and the light-emitting layer 113, a layer that controls transport of electron carriers may be provided. This is a layer formed by addition of a small amount of a substance having a high electron-trapping property to the aforementioned materials having a high electron-transport property, and the layer is capable of adjusting carrier balance by retarding transport of electron carriers. Such a structure is very effective in preventing a problem (such as a reduction in element lifetime) caused when electrons pass through the light-emitting layer.

In addition, the electron-injection layer 115 may be provided in contact with the second electrode 102 between the electron-transport layer 114 and the second electrode 102. For the electron-injection layer 115, an alkali metal, an alkaline earth metal, or a compound thereof, such as lithium fluoride (LiF), cesium fluoride (CsF), or calcium fluoride ($CaF_2$), can be used. For example, a layer that is formed using a substance having an electron-transport property and contains an alkali metal, an alkaline earth metal, or a compound thereof can be used. Note that a layer that is formed using a substance having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Any of a variety of methods can be used to form the EL layer 103 regardless of whether it is a dry process or a wet process. For example, a vacuum evaporation method, an inkjet method, a spin coating method, or the like may be used. Different formation methods may be used for the electrodes or the layers.

In addition, the electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows due to a potential difference applied between the first electrode 101 and the second electrode 102, and holes and electrons recombine in the light-emitting layer 113, so that light is emitted.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Further, in order that transfer of energy from an exciton generated in the light-emitting layer can be suppressed, preferably, the hole-transport layer and the electron-transport layer which are in contact with the light-emitting layer 113, particularly a carrier-transport layer in contact with a side closer to the light-emitting region in the light-emitting layer 113, are formed using a substance having a wider band gap than the light-emitting substance of the light-emitting layer or the emission center substance included in the light-emitting layer.

Note that this embodiment can be combined with any of the other embodiments as appropriate.

Next, an embodiment of a light-emitting element with a structure in which a plurality of light-emitting units are stacked (hereinafter this type of light-emitting element is also referred to as a stacked element) is described with reference to FIG. 1B. In this light-emitting element, a plurality of light-emitting units are provided between a first electrode and a second electrode. One light-emitting unit has a structure similar to that of the EL layer 103, which is illustrated in FIG. 1A. In other words, the light-emitting element illustrated in FIG. 1A includes a single light-emitting unit; the light-emitting element in this embodiment includes a plurality of light-emitting units.

Figure 1B:
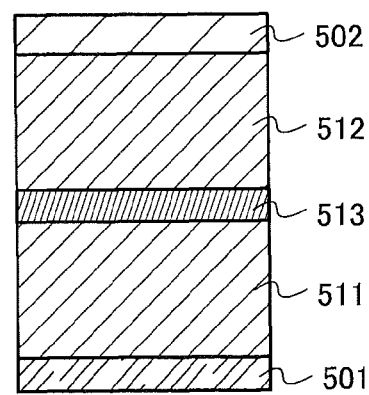

In FIG. 1B, a first light-emitting unit 511 and a second light-emitting unit 512 are stacked between a first electrode 501 and a second electrode 502, and a charge-generation layer 513 is provided between the first light-emitting unit 511 and the second light-emitting unit 512. The first electrode 501 and the second electrode 502 correspond, respectively, to the first electrode 101 and the second electrode 102 illustrated in FIG. 1A, and the materials given in the description for FIG. 1A can be used. Further, the first light-emitting unit 511 and the second light-emitting unit 512 may have the same structure or different structures.

The charge-generation layer 513 includes a composite material of an organic compound and a metal oxide. As the composite material of the organic compound and the metal oxide, the composite material which can be used for the hole-injection layer 111 illustrated in FIG. 1A can be used. Note that when the anode side of a light-emitting unit is in contact with a charge-generation layer, the charge-generation layer can also serve as a hole-injection layer of the light-emitting unit; thus, a hole-injection layer does not need to be formed in the light-emitting unit.

The charge-generation layer 513 may have a stacked-layer structure of a layer containing a composite material of an organic compound and a metal oxide and a layer containing another material. For example, a layer containing a composite material of an organic compound and a metal oxide may be combined with a layer containing a compound of a substance selected from substances with an electron-donating property and a compound with a high electron-transport property. Moreover, a layer containing a composite material of an organic compound and a metal oxide may be combined with a transparent conductive film.

An electron-injection buffer layer may be provided between the charge-generation layer 513 and the light-emitting unit on the anode side of the charge-generation layer. The electron-injection buffer layer is formed by stacking a very thin film of an alkali metal and an electron-relay layer containing a substance having an electron-transport property. The very thin film of the alkali metal corresponds to the electron-injection layer 115 and has a function of lowering an electron injection barrier. The electron-relay layer has a function of preventing an interaction between the film of the alkali metal and the charge-generation layer and smoothly transferring electrons.

As the substance having an electron-transport property which is contained in the electron-relay layer of the electron-injection buffer layer, it is preferable to select a substance having a LUMO level between the LUMO level of the substance having an acceptor property which is contained in the charge-generation layer 513 in contact with the electron-injection buffer layer and the LUMO level of a substance (NBPhen) contained in the layer containing NBPhen in contact with the electron-injection buffer layer. Specifically, the LUMO level of the substance having an electron-transport property which is contained in the electron-relay layer is preferably higher than or equal to −5.0 eV, more preferably higher than or equal to −5.0 eV and lower than or equal to −3.0 eV. Note that as the substance having an electron-transport property in an electron-injection buffer region, a phthalocyanine-based material or a metal complex having a metal-oxygen bond and an aromatic ligand is preferably used.

In the case where the electron-injection buffer layer is formed, the film of the alkali metal of the electron-injection buffer layer serves as the electron-injection layer in the light-emitting unit on the anode side; therefore, the light-emitting unit does not further need an electron-injection layer.

In the case where the above-described film of the alkali metal is a film containing lithium, crosstalk between adjacent pixels can be suppressed in a display device including light-emitting elements having the above structure. Accordingly, the display device can provide remarkably high-quality images and videos.

The light-emitting element having two light-emitting units is described with reference to FIG. 1B; however, the present invention can be similarly applied to a light-emitting element in which three or more light-emitting units are stacked. With a plurality of light-emitting units partitioned by the charge-generation layer between a pair of electrodes as in the light-emitting element according to this embodiment, it is possible to provide a light-emitting element which can emit light with high luminance with the current density kept low and has a long lifetime. Moreover, a light-emitting device having low power consumption, which can be driven at low voltage, can be achieved.

Further, when emission colors of light-emitting units are made different, light emission of a desired color can be provided from the light-emitting element as a whole. For example, in a light-emitting element having two light-emitting units, the emission colors of the first light-emitting unit may be red and green and the emission color of the second light-emitting unit may be blue, so that the light-emitting element can emit white light as the whole element.

The above-described structure can be combined with any of the structures in this embodiment and the other embodiments.

The light-emitting element having the above structure in this embodiment has high heat resistance. In particular, a light-emitting element having a structure in which a layer containing a condensed heteroaromatic compound and a layer containing NBPhen are stacked is highly useful because not only a luminance decrease but also a voltage decrease can be suppressed in measurement of characteristics before and after a high-temperature exposition test.

Embodiment 3

In this embodiment, a different embodiment of the present invention is described. In the light-emitting element described in Embodiment 1 or 2, NBPhen is used for a layer on the cathode side (the layer 114m containing NBPhen) in the electron-transport layer 114.

It is preferable that the concentration of impurities in NBPhen, particularly the concentration of NBPhen derivatives mono-substituted by chlorine, be low, in which case a highly reliable light-emitting element can be provided.

The impurity concentration of a material used for the EL layer 103 normally has an insignificant influence on a layer positioned apart from the light-emitting layer 113. However, the concentration of impurities in NBPhen solid (particularly the concentration of NBPhen derivatives mono-substituted by chlorine) has an influence on the reliability of a light-emitting element even when NBPhen exists apart from the light-emitting layer 113. Therefore, in a light-emitting element including NBPhen, the concentration of impurities (particularly NBPhen derivatives mono-substituted by chlorine) is preferably low. Specifically, with the use of a material in which the amount of chlorine in NBPhen is 100 ppm or less for a light-emitting element, deterioration of the light-emitting element can be minimized, so that a highly reliable light-emitting element can be obtained. Meanwhile, the impurity concentration indicates the chlorine concentration in 100 μL of the absorption solution for 1 g of NBPhen solid measured by combustion ion chromatography. Therefore, the above impurity concentration is equivalent to a chlorine concentration in NBPhen solid of $1.0 \times 10^{-2}$ g/kg, and is equivalent to a concentration of a chlorine mono-substituted derivative in NBPhen solid of $1.7 \times 10^{-1}$ g/kg.

Note that in order to achieve the effect of improving reliability, the layer 114n containing the condensed aromatic compound or the condensed heteroaromatic compound in the light-emitting element described in Embodiment 1 or 2 may include any kind of material. In other words, the layer 114n containing the condensed aromatic compound or the condensed heteroaromatic compound does not necessarily include the condensed aromatic compound or the condensed heteroaromatic compound, and a given electron-transport material can be used. In that case, the layer 114n containing the condensed aromatic compound or the condensed heteroaromatic compound may be described as a first electron-transport layer 114n.

As described above, the light-emitting element of this embodiment includes at least the pair of electrodes (the first electrode 101 and the second electrode 102) and the EL layer 103 including the light-emitting layer 113 and the electron-transport layer 114 containing NBPhen, and the amount of chlorine in NBPhen contained in the electron-transport layer 114 is less than or equal to 100 ppm. The light-emitting element includes at least the pair of electrodes (the first electrode 101 and the second electrode 102) and the EL layer 103 including the light-emitting layer 113 and the electron-transport layer 114 including the first electron-transport layer 114n and the layer 114m containing NBPhen, and the amount of chlorine in NBPhen contained in the layer 114m is less than or equal to 100 ppm. Alternatively, the light-emitting element includes at least the pair of electrodes (the first electrode 101 and the second electrode 102) and the EL layer 103 including the light-emitting layer 113 and the electron-transport layer 114 including the layer 114m containing NBPhen formed apart from the light-emitting layer 113, and the amount of chlorine in NBPhen contained in the layer 114m is less than or equal to 100 ppm. Such a light-emitting element has high reliability. Here, the above impurity concentration corresponds to a value obtained by the aforementioned measurement.

Note that NBPhen with a chlorine content of 100 ppm or less is also an embodiment of the present invention. In particular, NBPhen with the content of chlorine derived from the chlorine mono-substituted compound being less than or equal to 100 ppm is an embodiment of the present invention. Here, the impurity concentration corresponds to a value obtained by the aforementioned measurement Embodiment 4

In this embodiment, a light-emitting device including the light-emitting element described in any of Embodiments 1 to 3 is described.

Figure 2A:
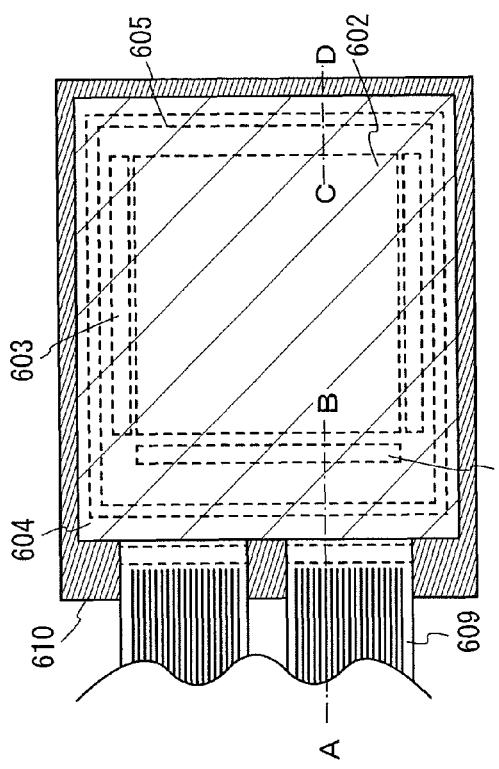
FIGS. 2A and 2B are schematic diagrams of an active matrix light-emitting device.
Figure 2B:
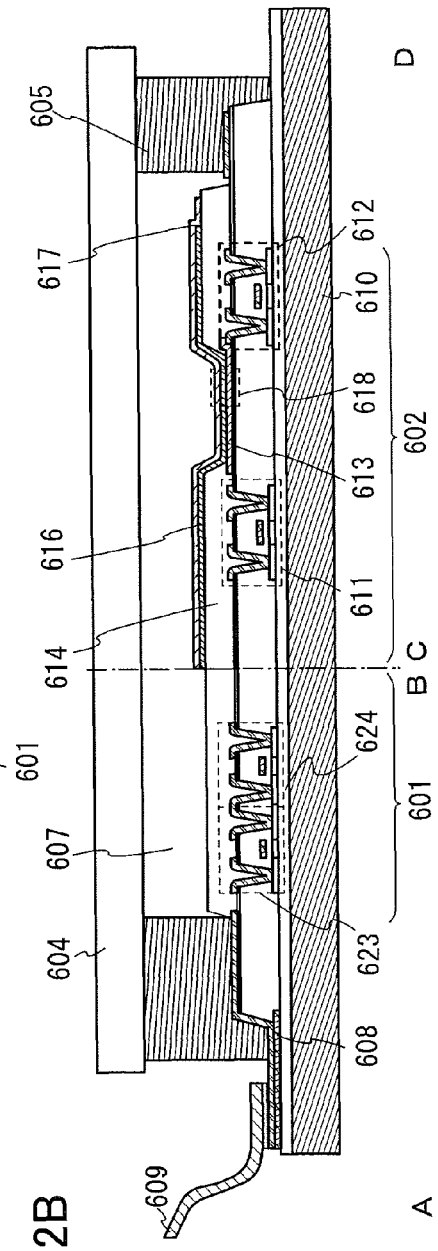

In this embodiment, the light-emitting device manufactured using the light-emitting element described in any of Embodiments 1 to 3 is described with reference to FIGS. 2A and 2B. Note that FIG. 2A is a top view of the light-emitting device and FIG. 2B is a cross-sectional view taken along the lines A-B and C-D in FIG. 2A. This light-emitting device includes a driver circuit portion (source line driver circuit) 601, a pixel portion 602, and a driver circuit portion (gate line driver circuit) 603, which are to control light emission of a light-emitting element and illustrated with dotted lines. Reference numeral 604 denotes a sealing substrate; 605, a sealing material; and 607, a space surrounded by the sealing material 605.

Reference numeral 608 denotes a wiring for transmitting signals to be input to the source line driver circuit 601 and the gate line driver circuit 603 and receiving signals such as a video signal, a clock signal, a start signal, and a reset signal from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure will be described with reference to FIG. 2B. The driver circuit portion and the pixel portion are formed over an element substrate 610; FIG. 2B shows the source line driver circuit 601, which is a driver circuit portion, and one of the pixels in the pixel portion 602.

As the source line driver circuit 601, a CMOS circuit in which an n-channel FET 623 and a p-channel FET 624 are combined is formed. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and a first electrode 613 electrically connected to a drain of the current controlling FET 612. Note that to cover an end portion of the first electrode 613, an insulator 614 is formed, for which a positive photosensitive acrylic resin film is used here.

In order to improve coverage, the insulator 614 is formed to have a curved surface with curvature at its upper or lower end portion. For example, in the case where positive photosensitive acrylic is used for a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in any of Embodiments 1 to 3.

As a material used for the second electrode 617, which is formed over the EL layer 616 and functions as a cathode, a material having a low work function (e.g., Al, Mg, Li, and Ca, or an alloy or a compound thereof, such as MgAg, MgIn, and AlLi) is preferably used. In the case where light generated in the EL layer 616 is transmitted through the second electrode 617, a transparent conductive film (e.g., ITO, indium oxide containing zinc oxide at 2 wt % to 20 wt %, indium tin oxide containing silicon, or zinc oxide (ZnO)) or a stack of a thin metal film and a transparent conductive film is preferably used for the second electrode 617.

Note that the light-emitting element is formed with the first electrode 613, the EL layer 616, and the second electrode 617. The light-emitting element has the structure described in any of Embodiments 1 to 3. In the light-emitting device of this embodiment, the pixel portion, which includes a plurality of light-emitting elements, may include both the light-emitting element described in any of Embodiments 1 to 3 and a light-emitting element having a different structure.

The sealing substrate 604 is attached to the element substrate 610 with the sealing material 605, so that a light-emitting element 618 is provided in the space 607 surrounded by the element substrate 610, the sealing substrate 604, and the sealing material 605. The space 607 may be filled with filler, or may be filled with an inert gas (such as nitrogen or argon), or the sealing material 605. It is preferable that the sealing substrate be provided with a recessed portion and a drying agent be provided in the recessed portion, in which case deterioration due to influence of moisture can be suppressed.

An epoxy-based resin or glass frit is preferably used for the sealing material 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, and acrylic can be used.

As described above, the light-emitting device which uses the light-emitting element described in any of Embodiments 1 to 3 can be obtained.

The light-emitting device in this embodiment is fabricated using the light-emitting element described in any of Embodiments 1 to 3 and thus can have favorable characteristics. Specifically, since the light-emitting element described in any of Embodiments 1 to 3 has high heat resistance, the light-emitting device can have high heat resistance. Alternatively, the light-emitting element described in any of Embodiments 1 to 3 has high reliability, the light-emitting device can have high reliability.

FIGS. 3A and 3B each illustrate an example of a light-emitting device in which full color display is achieved by formation of a light-emitting element exhibiting white light emission and with the use of coloring layers (color filters) and the like. In FIG. 3A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition 1025, an EL layer 1028, a second electrode 1029 of the light-emitting elements, a sealing substrate 1031, a sealing material 1032, and the like are illustrated.

In FIG. 3A, coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 3A, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, blue, or green, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 4:
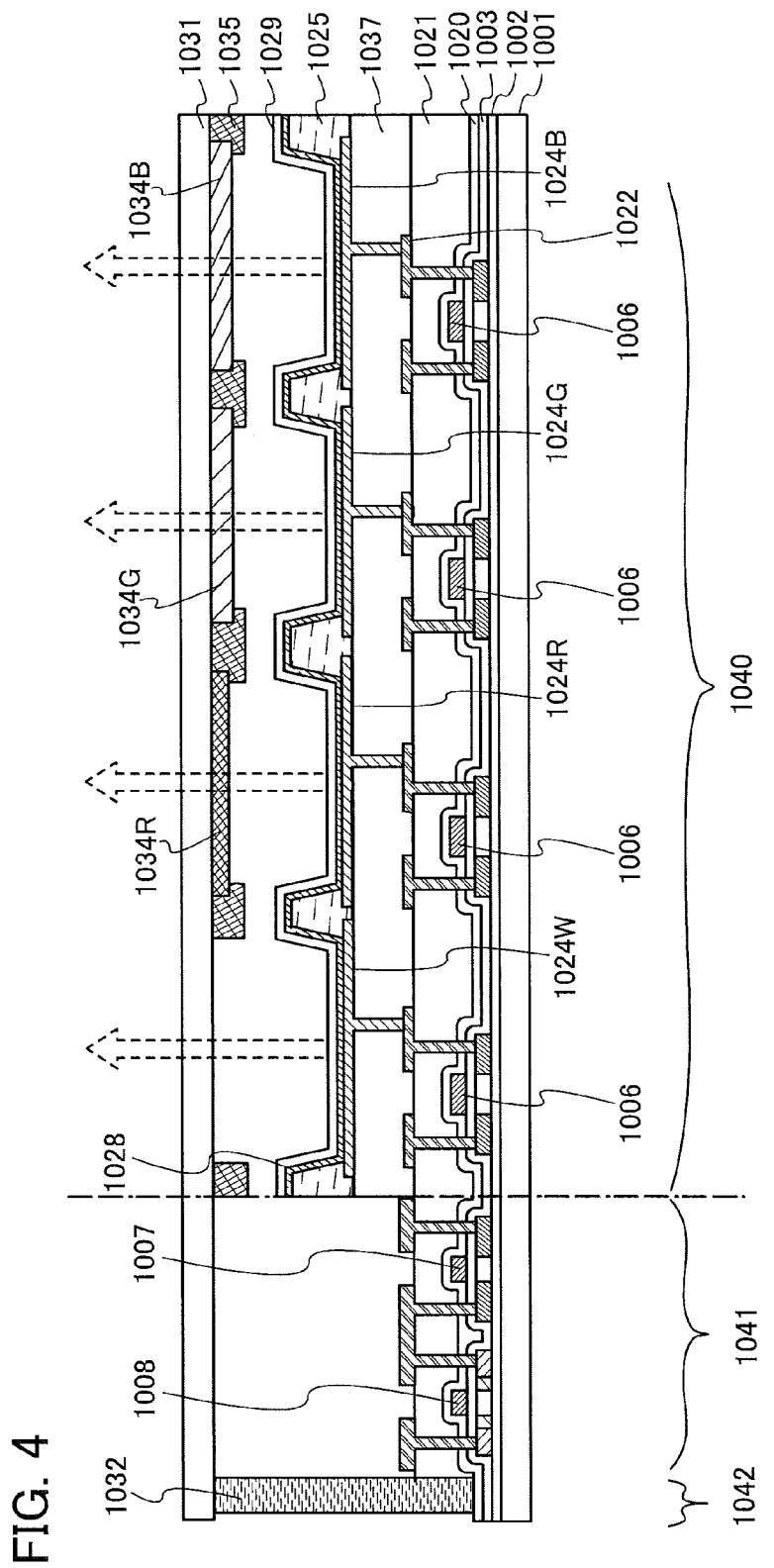
FIG. 4 is a schematic diagram of an active matrix light-emitting device.

The above-described light-emitting device is a light-emitting device having a structure in which light is extracted from the substrate 1001 side where the FETs are formed (a bottom emission structure), but may be a light-emitting device having a structure in which light is extracted from the sealing substrate 1031 side (a top emission structure). FIG. 4 is a cross-sectional view of a light-emitting device having a top emission structure. In this case, a substrate which does not transmit light can be used as the substrate 1001. The process up to the step of forming a connection electrode which connects the FET and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other various materials.

The first electrodes 1024W, 1024R, 1024G, and 1024B of the light-emitting elements each serve as an anode here, but may serve as a cathode. Further, in the case of a light-emitting device having a top emission structure as illustrated in FIG. 4, the first electrodes are preferably reflective electrodes. The EL layer 1028 is formed to have a structure similar to the structure of the EL layer 103, which is described in any of Embodiments 1 to 3, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (black matrix) 1035 which is positioned between pixels. The coloring layers (the red coloring layer 1034R, the green coloring layer 1034G, and the blue coloring layer 1034B) and the black layer (black matrix) may be covered with an overcoat layer. Note that a light-transmitting substrate is used as the sealing substrate 1031.

Although an example in which full color display is performed using four colors of red, green, blue, and white is shown here, there is no particular limitation and full color display using three colors of red, green, and blue or four colors of red, yellow, green, and blue may be performed.

The light-emitting device in this embodiment is fabricated using the light-emitting element described in any of Embodiments 1 to 3 and thus can have favorable characteristics. Specifically, since the light-emitting element described in any of Embodiments 1 to 3 has high heat resistance, the light-emitting device can have high reliability.

Figure 5A:
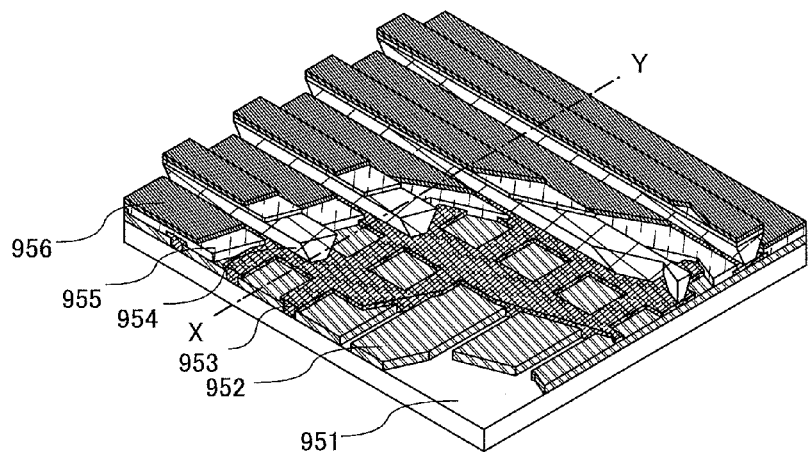
FIGS. 5A and 5B are schematic diagrams of a passive matrix light-emitting device.
Figure 5B:
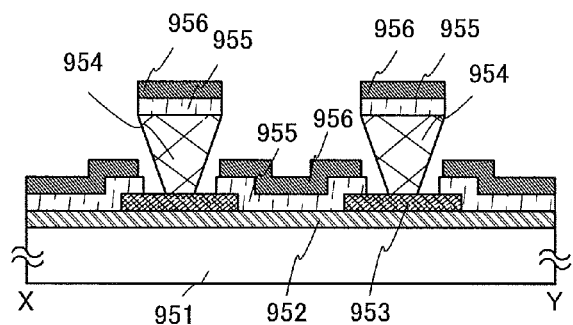

An active matrix light-emitting device is described above, whereas a passive matrix light-emitting device is described below. FIGS. 5A and 5B illustrate a passive matrix light-emitting device manufactured using the present invention. FIG. 5B is a cross-sectional view taken along the line X-Y in FIG. 5A. In FIGS. 5A and 5B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side in contact with the insulating layer 953, which is one of a pair of parallel sides of the trapezoidal cross section) is shorter than the upper side (a side not in contact with the insulating layer 953, which is the other one of the pair of parallel sides). The partition layer 954 thus provided can prevent defects in the light-emitting element due to static electricity or others. The passive-matrix light-emitting device also includes the light-emitting element with high heat resistance described in any of Embodiments 1 to 3; thus, the light-emitting device can have high reliability.

Since many minute light-emitting elements arranged in a matrix in the light-emitting device described above can each be controlled, the light-emitting device can be suitably used as a display device for displaying images.

This embodiment can be freely combined with any of other embodiments.

Embodiment 5

Figure 6A:
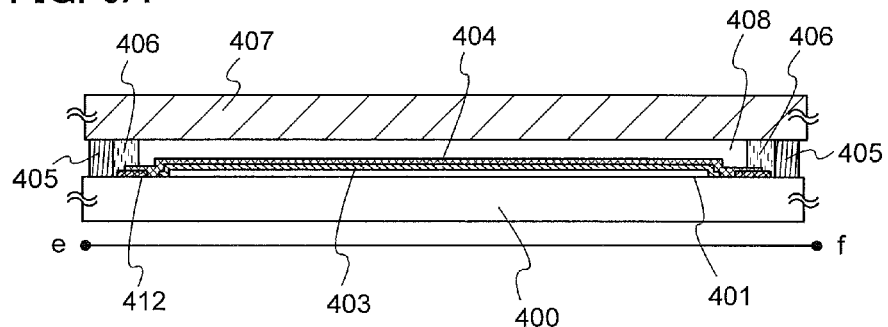
FIGS. 6A and 6B illustrate a lighting device.
Figure 6B:
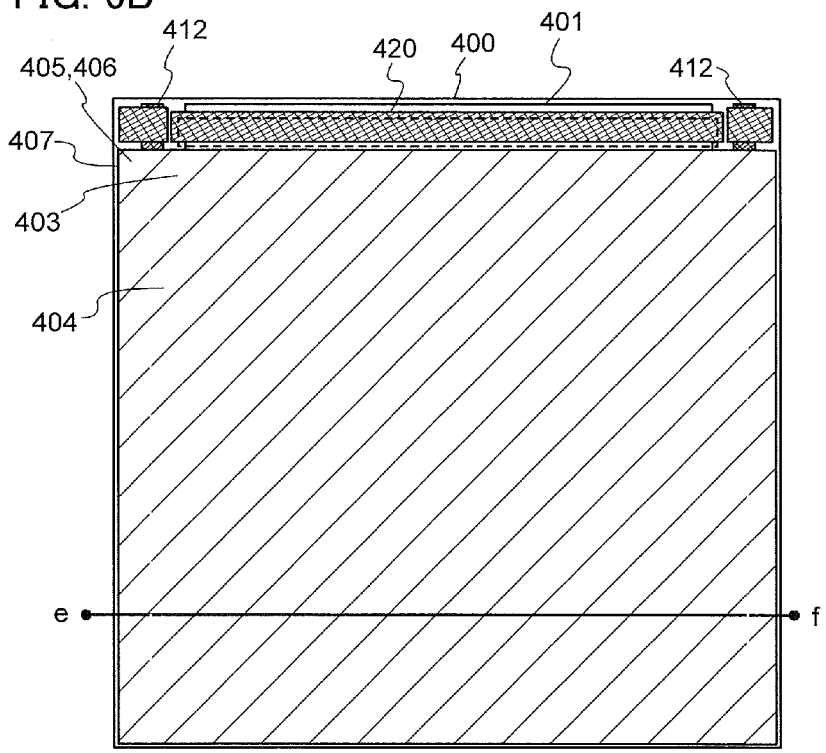

In this embodiment, an example in which the light-emitting element described in any of Embodiments 1 to 3 is used for a lighting device will be described with reference to FIGS. 6A and 6B. FIG. 6B is a top view of the lighting device, and FIG. 6A is a cross-sectional view taken along the line e-f in FIG. 6B.

In the lighting device in this embodiment, a first electrode 401 is formed over a substrate 400 which is a support and has a light-transmitting property. The first electrode 401 corresponds to the first electrode 101 in Embodiment 1. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 1, or the structure in which the light-emitting units 511 and 512 and the charge-generation layer 513 are combined. Refer to the descriptions for the structure.

The second electrode 404 is formed to cover the EL layer 403. The second electrode 404 corresponds to the second electrode 102 in Embodiment 1. The second electrode 404 is formed using a material having high reflectance when light is extracted through the first electrode 401 side. The second electrode 404 is connected to the pad 412, whereby voltage is applied.

As described above, the lighting device described in this embodiment includes a light-emitting element including the first electrode 401, the EL layer 403, and the second electrode 404. Since the light-emitting element is a light-emitting element with high emission efficiency, the lighting device in this embodiment can be a lighting device having low power consumption.

The light-emitting element having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not shown in FIG. 6B) can be mixed with a desiccant which enables moisture to be adsorbed, increasing reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

The lighting device described in this embodiment includes as an EL element the light-emitting element with high heat resistance described in any of Embodiments 1 to 3; thus, the lighting device can have high reliability.

Embodiment 6

In this embodiment, examples of electronic devices each including the light-emitting element described in any of Embodiments 1 to 3 will be described. The light-emitting element described in any of Embodiments 1 to 3 has high heat resistance and high reliability. As a result, the electronic devices described in this embodiment can each include a display portion having high reliability.

Examples of the electronic device to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are given below.

FIG. 7A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting elements described in any of Embodiments 1 to 3 are arranged in a matrix.

Operation of the television device can be performed with an operation switch of the housing 7101 or a separate remote controller 7110. With operation keys 7109 of the remote controller 7110, channels and volume can be controlled and images displayed on the display portion 7103 can be controlled. The remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured by arranging light-emitting elements similar to those described in any of Embodiments 1 to 3 in a matrix in the display portion 7203. The computer illustrated in FIG. 7B1 may have a structure illustrated in FIG. 7B2. The computer illustrated in FIG. 7B2 is provided with a second display portion 7210 instead of the keyboard 7204 and the pointing device 7206. The second display portion 7210 has a touch screen, and input can be performed by operation of images, which are displayed on the second display portion 7210, with a finger or a dedicated pen. The second display portion 7210 can also display images other than the display for input. The display portion 7203 may also have a touch screen. Connecting the two screens with a hinge so that the computer becomes foldable can prevent troubles; for example, the screens can be prevented from being cracked or broken while the computer is being stored or carried.

FIG. 7C illustrates a portable game machine having two housings, a housing 7301 and a housing 7302, which are connected with a joint portion 7303 so that the portable game machine can be folded. The housing 7301 incorporates a display portion 7304 including the light-emitting elements described in any of Embodiments 1 to 3 and arranged in a matrix, and the housing 7302 incorporates a display portion 7305. In addition, the portable game machine illustrated in FIG. 7C includes a speaker portion 7306, a recording medium insertion portion 7307, an LED lamp 7308, input means (an operation key 7309, a connection terminal 7310, a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion which includes the light-emitting elements described in any of Embodiments 1 to 3 and arranged in a matrix is used as either the display portion 7304 or the display portion 7305, or both, and the structure can include other accessories as appropriate. The portable game machine illustrated in FIG. 7C has a function of reading out a program or data stored in a recoding medium to display it on the display portion, and a function of sharing information with another portable game machine by wireless communication. Note that functions of the portable game machine illustrated in FIG. 7C are not limited to them, and the portable game machine can have various functions.

FIG. 7D illustrates an example of a mobile phone. The mobile phone is provided with a display portion 7402 incorporated in a housing 7401, operation buttons 7403, an external connection port 7404, a speaker 7405, a microphone 7406, and the like. Note that the mobile phone has the display portion 7402 including the light-emitting elements described in any of Embodiments 1 to 3 and arranged in a matrix.

When the display portion 7402 of the mobile phone illustrated in FIG. 7D is touched with a finger or the like, data can be input into the mobile phone. In this case, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating an e-mail, a character input mode is selected for the display portion 7402 so that characters displayed on a screen can be input. In this case, it is preferable to display a keyboard or number buttons on almost the entire screen of the display portion 7402.

When a sensing device including a sensor such as a gyroscope or an acceleration sensor for detecting inclination is provided inside the mobile phone, display on the screen of the display portion 7402 can be automatically changed in direction by determining the orientation of the mobile phone (whether the mobile phone is placed horizontally or vertically).

The screen modes are switched by touch on the display portion 7402 or operation with the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by the display portion 7402 while in touch with the palm or the finger, whereby personal authentication can be performed. Further, by providing a backlight or a sensing light source which emits a near-infrared light in the display portion, an image of a finger vein, or a palm vein can be taken.

Note that the structure described in this embodiment can be combined with any of the structures described in Embodiments 1 to 5 as appropriate.

As described above, the application range of the light-emitting device including the light-emitting element described in any of Embodiments 1 to 3 is wide so that this light-emitting device can be applied to electronic devices in a variety of fields. By using the light-emitting element described in any of Embodiments 1 to 3, an electronic device having high heat resistance and high reliability can be obtained.

Figure 8:
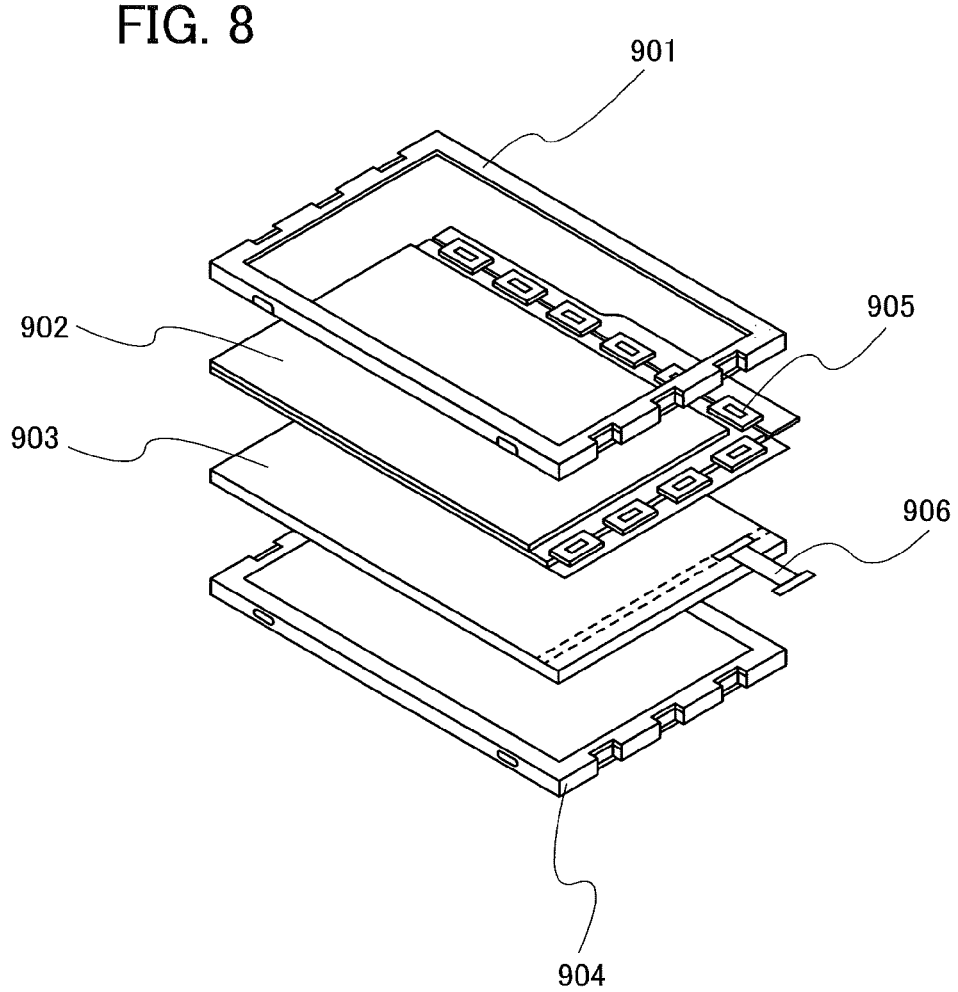
FIG. 8 illustrates a light source device.

FIG. 8 illustrates an example of a liquid crystal display device using the light-emitting element described in any of Embodiments 1 to 3 for a backlight. The liquid crystal display device illustrated in FIG. 8 includes a housing 901, a liquid crystal layer 902, a backlight unit 903, and a housing 904. The liquid crystal layer 902 is connected to a driver IC 905. The light-emitting element described in any of Embodiments 1 to 3 is used for the backlight unit 903, to which current is supplied through a terminal 906.

The light-emitting element described in any of Embodiments 1 to 3 is used for the backlight of the liquid crystal display device; thus, the backlight can have reduced power consumption. In addition, the use of the light-emitting element described in Embodiment 2 enables manufacture of a planar-emission lighting device and further a larger-area planar-emission lighting device; therefore, the backlight can be a larger-area backlight, and the liquid crystal display device can also be a larger-area device. Furthermore, the light-emitting device including the light-emitting element described in Embodiment 2 can be thinner than a conventional one; accordingly, the display device can also be thinner.

Figure 9:
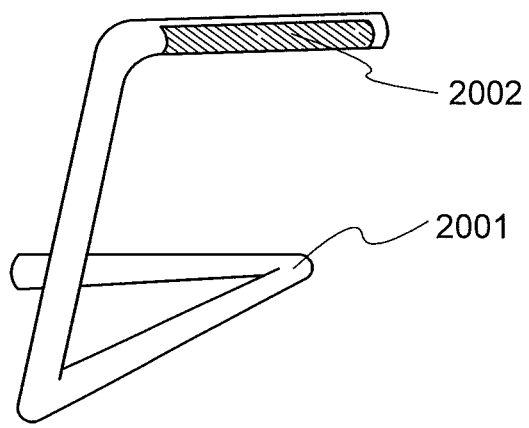
FIG. 9 illustrates a lighting device.

FIG. 9 illustrates an example in which the light-emitting element described in any of Embodiments 1 to 3 is used for a table lamp which is a lighting device. The table lamp illustrated in FIG. 9 includes a housing 2001 and a light source 2002, and the lighting device described in Embodiment 5 is used for the light source 2002.

Figure 10:
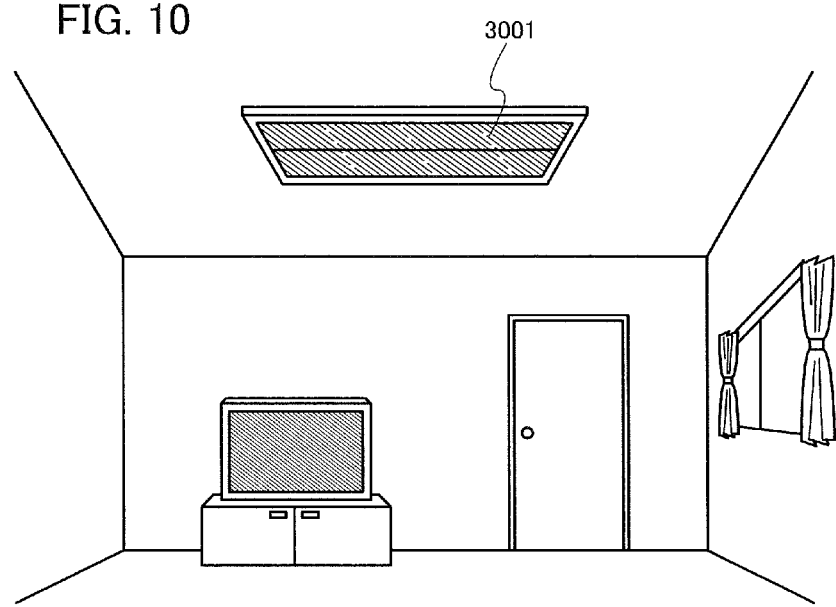
FIG. 10 illustrates a lighting device.

FIG. 10 illustrates an example in which the light-emitting element described in any of Embodiments 1 to 3 is used for an indoor lighting device 3001. Since the light-emitting element described in any of Embodiments 1 to 3 has high heat resistance, the lighting device can have high reliability. Further, since the light-emitting element described in any of Embodiments 1 to 3 can have a large area, the light-emitting element can be used for a large-area lighting device. Furthermore, since the light-emitting element described in any of Embodiments 1 to 3 is thin, the light-emitting element can be used for a lighting device having a reduced thickness.

Figure 11:
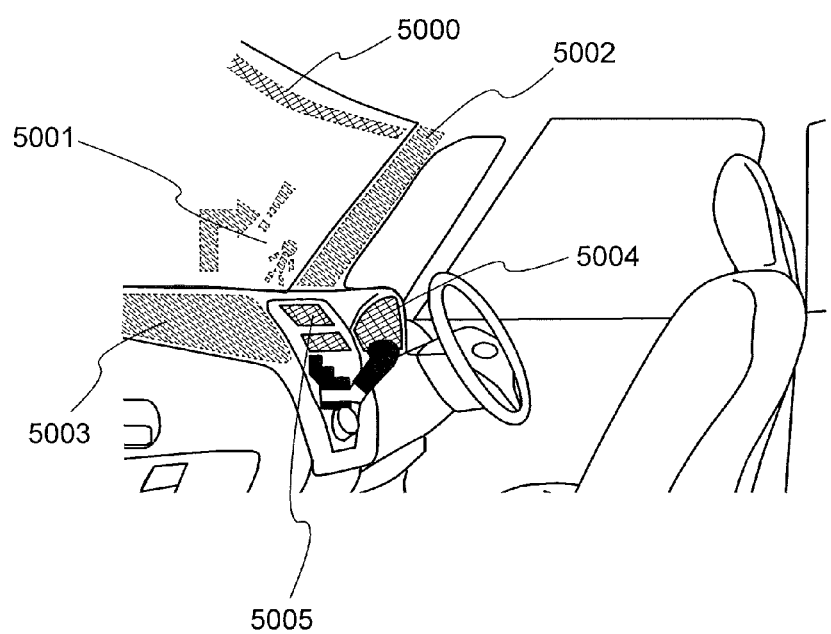
FIG. 11 illustrates in-vehicle display devices and lighting devices.

The light-emitting element described in any of Embodiments 1 to 3 can also be used for an automobile windshield or an automobile dashboard. FIG. 11 illustrates one mode.

A display region 5000 and a display region 5001 are display devices provided in the automobile windshield in which the light-emitting elements described in any of Embodiments 1 to 3 are incorporated. The light-emitting elements described in any of Embodiments 1 to 3 can be formed into what is called a see-through display device, through which the opposite side can be seen, by including a first electrode and a second electrode formed of electrodes having light-transmitting properties. Such see-through display devices can be provided even in the automobile windshield, without hindering the vision. Note that in the case where a driving transistor or the like is provided, a transistor having a light-transmitting property, such as an organic transistor using an organic semiconductor material or a transistor using an oxide semiconductor, is preferably used.

A display region 5002 is a display device provided in a pillar portion in which the light-emitting elements described in any of Embodiments 1 to 3 are incorporated. The display region 5002 can compensate for the view hindered by the pillar portion by showing an image taken by an imaging unit provided in the car body. Similarly, a display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

A display region 5004 and a display region 5005 can provide a variety of kinds of information such as navigation data, a speedmeter, a tachometer, a mileage, a fuel level, a gearshift state, and air-condition setting. The content of the display can be freely changed by a user as appropriate. Note that such information can also be shown by the display regions 5000 to 5003. The display regions 5000 to 5005 can also be used as lighting devices.

The light-emitting element described in any of Embodiments 1 to 3 has high heat resistance. Accordingly, the light-emitting element described in any of Embodiments 1 to 3 can be suitably used for an in-vehicle light-emitting device or lighting device which is to be placed in a very high-temperature environment in midsummer or the like.

Figure 12A:
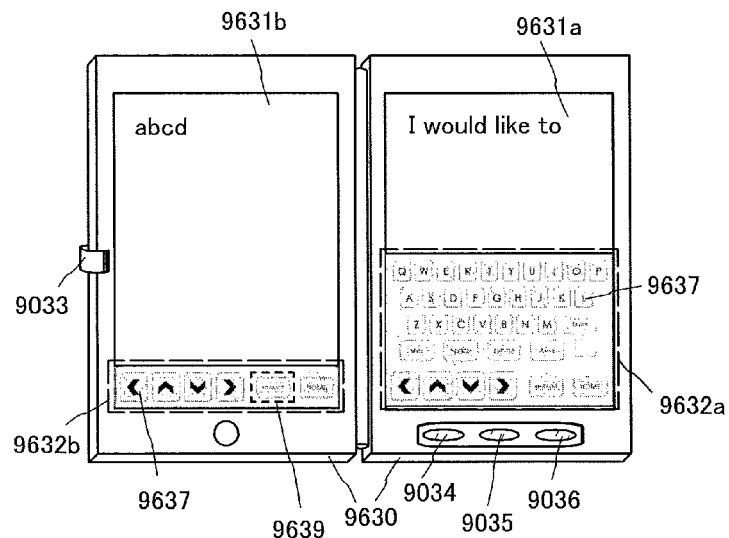
FIGS. 12A to 12C illustrate an electronic device.
Figure 12B:
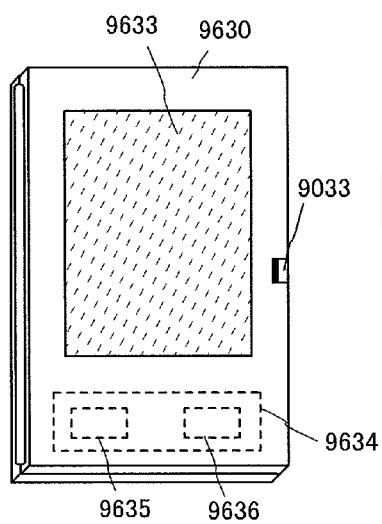

FIGS. 12A and 12B illustrate an example of a foldable tablet terminal. FIG. 12A illustrates the tablet terminal which is unfolded. The tablet terminal includes a housing 9630, a display portion 9631a, a display portion 9631b, a display mode switch 9034, a power switch 9035, a power-saving mode switch 9036, and a clasp 9033. Note that in the tablet terminal, one or both of the display portion 9631a and the display portion 9631b is/are formed using a light-emitting device which includes the light-emitting element described in any of Embodiments 1 to 3.

Part of the display portion 9631a can be a touchscreen region 9632a and data can be input when a displayed operation key 9637 is touched. Although half of the display portion 9631a has only a display function and the other half has a touchscreen function, one embodiment of the present invention is not limited to the structure. The whole display portion 9631a may have a touchscreen function. For example, a keyboard can be displayed on the entire region of the display portion 9631a so that the display portion 9631a is used as a touchscreen, and the display portion 9631b can be used as a display screen.

Like the display portion 9631a, part of the display portion 9631b can be a touchscreen region 9632b. When a switching button 9639 for showing/hiding a keyboard on the touchscreen is touched with a finger, a stylus, or the like, the keyboard can be displayed on the display portion 9631b.

Touch input can be performed in the touchscreen region 9632a and the touchscreen region 9632b at the same time.

The display mode switch 9034 can switch the display between portrait mode, landscape mode, and the like, and between monochrome display and color display, for example. The power-saving mode switch 9036 can control display luminance in accordance with the amount of external light in use of the tablet terminal sensed by an optical sensor incorporated in the tablet terminal. Another sensing device including a sensor such as a gyroscope or an acceleration sensor for sensing inclination may be incorporated in the tablet terminal, in addition to the optical sensor.

Although FIG. 12A illustrates an example in which the display portion 9631a and the display portion 9631b have the same display area, one embodiment of the present invention is not limited to the example. The display portion 9631a and the display portion 9631b may have different display areas and different display quality. For example, higher definition images may be displayed on one of the display portions 9631a and 9631b.

FIG. 12B illustrates the tablet terminal which is folded. The tablet terminal in this embodiment includes the housing 9630, a solar cell 9633, a charge and discharge control circuit 9634, a battery 9635, and a DCDC converter 9636. In FIG. 12B, a structure including the battery 9635 and the DCDC converter 9636 is illustrated as an example of the charge and discharge control circuit 9634.

Since the tablet terminal is foldable, the housing 9630 can be closed when the tablet terminal is not in use. As a result, the display portion 9631a and the display portion 9631b can be protected, thereby providing a tablet terminal with high endurance and high reliability for long-term use.

The tablet terminal illustrated in FIGS. 12A and 12B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that a structure in which the solar cell 9633 is provided on one or both surfaces of the housing 9630 is preferable because the battery 9635 can be charged efficiently.

Figure 12C:
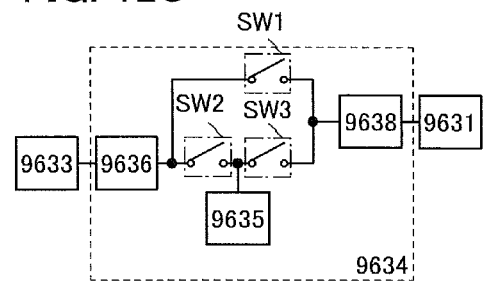

The structure and operation of the charge and discharge control circuit 9634 illustrated in FIG. 12B will be described with reference to a block diagram of FIG. 12C. FIG. 12C illustrates the solar cell 9633, the battery 9635, the DCDC converter 9636, a converter 9638, switches SW1 to SW3, and a display portion 9631. The battery 9635, the DCDC converter 9636, the converter 9638, and the switches SW1 to SW3 correspond to the charge and discharge control circuit 9634 illustrated in FIG. 12B.

First, description is made on an example of the operation in the case where power is generated by the solar cell 9633 with the use of external light. The voltage of the power generated by the solar cell is raised or lowered by the DCDC converter 9636 so as to be voltage for charging the battery 9635. Then, when power from the solar cell 9633 is used for the operation of the display portion 9631, the switch SW1 is turned on and the voltage of the power is raised or lowered by the converter 9638 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module capable of performing charging by transmitting and receiving power wirelessly (without contact), or any of the other charge means used in combination, and the power generation means is not necessarily provided.

One embodiment of the present invention is not limited to the tablet terminal having the shape illustrated in FIGS. 12A to 12C as long as the display portion 9631 is included.

Example 1

In this example, light-emitting elements (light-emitting elements 1 to 3) of one embodiment of the present invention and comparative light-emitting elements (comparative light-emitting elements 1 to 3) will be described. Structure formulae of organic compounds used in the light-emitting elements 1 to 3 and the comparative light-emitting elements 1 to 3 are shown below.

(i)

DBT3P-II (ii)

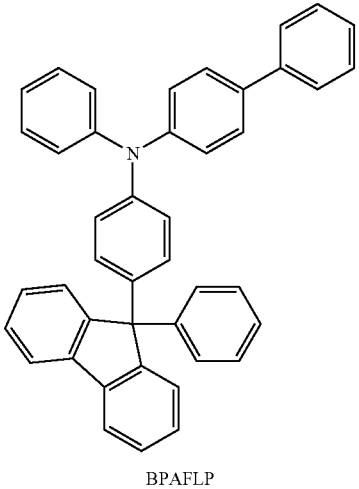

BPAFLP (iii)

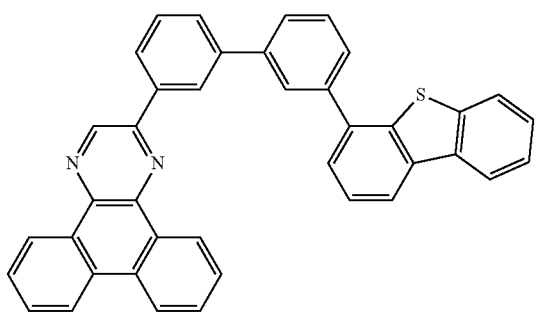

2mDBTBPDBq-II (iv)

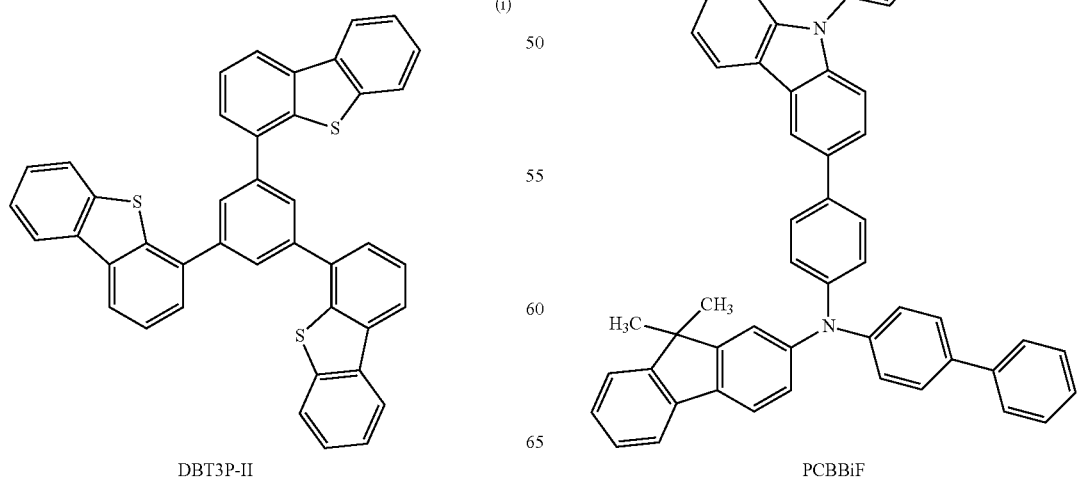

PCBBiF (v)
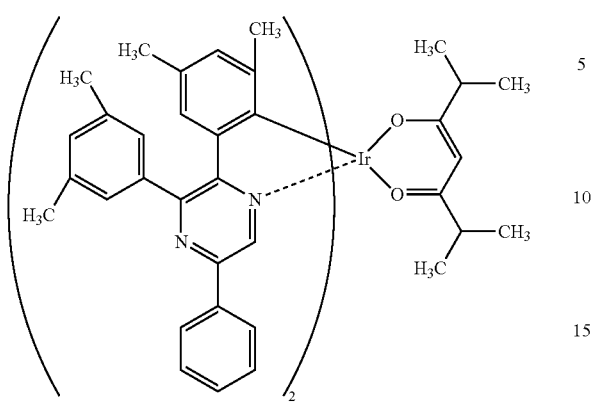
[Ir(dmdppr-P)₂(dibm)]
(vi)
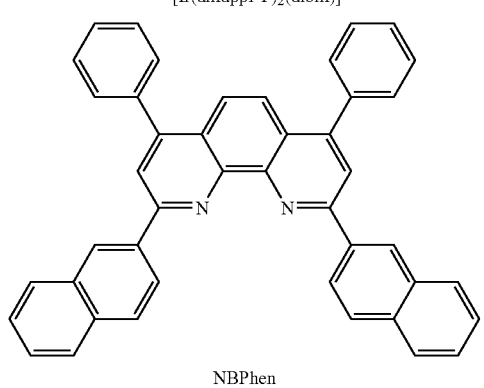
NBPhen
(vii)
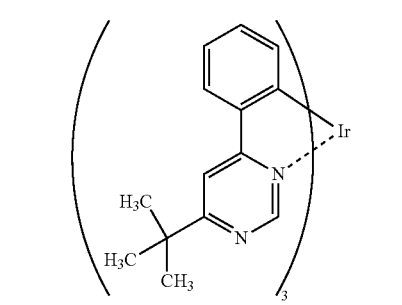
[Ir(tBuppm)₃]
(viii)
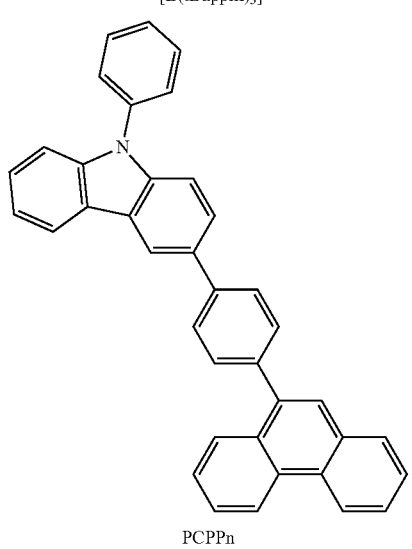
PCPPn
(ix)
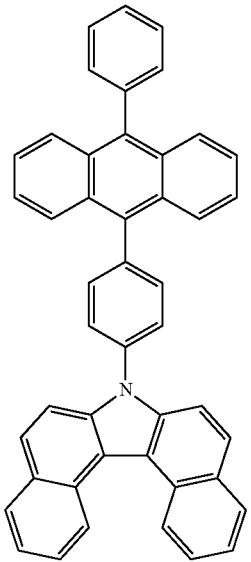
cgDBCzPA
(x)
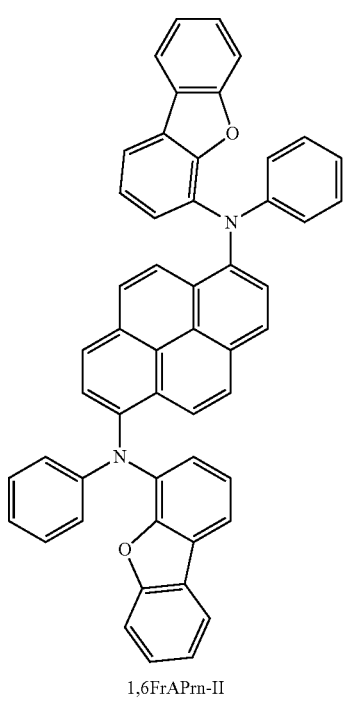
1,6FrAPrn-II
(xi)
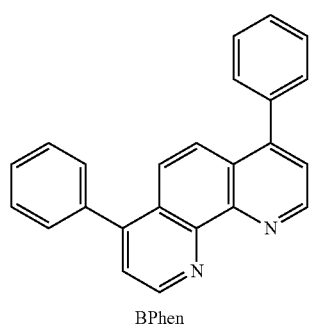
BPhen Methods for manufacturing the light-emitting elements 1 to 3 and the comparative light-emitting elements 1 to 3 of this example will be described below.

(Method for Manufacturing Light-Emitting Element 1)

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 functions as an anode of the light-emitting element.

Next, as pretreatment for forming the light-emitting element over the substrate, UV-ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 30 nm, and the weight ratio of DBT3P-II to molybdenum oxide was adjusted to 1:0.5 (=DBT3P-II: molybdenum oxide). Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Further, over the hole-transport layer 112, the light-emitting layer 113 was formed by co-evaporation of 2-[3'-(dibenzothiophen-4-yl)biphenyl-3-yl]dibenzo[f,h]quinoxaline (abbreviation: 2mDBTBPDBq-II) represented by Structural Formula (iii), N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (iv), and bis{4,6-dimethyl-2-[3-(3,5-dimethylphenyl)-5-phenyl-2-pyrazinyl-κN]phenyl-κC}(2,6-dimethyl-3,5-heptanedionato-κ²O,O')iridium(III) (abbreviation: [Ir(dmdppr-P)$_2$(dibm)]) represented by Structural Formula (v) with a weight ratio of 0.8:0.2:0.06 (=2mDBTBPDBq-II:PCBBiF: [Ir(dmdppr-P)$_2$(dibm)]) to a thickness of 40 nm.

Then, the electron-transport layer 114 was formed over the light-emitting layer 113 in such a manner that a 20 nm thick film of 2mDBTBPDBq-II was formed (the layer 114n containing the condensed aromatic compound or the condensed heteroaromatic compound) and a 20 nm thick film of 2,9-bis(naphthalen-2-yl)-4,7-diphenyl-1,10-phenanthroline (abbreviation: NBPhen) represented by Structural Formula (vi) was formed (the layer containing NBPhen).

After the formation of the electron-transport layer 114, lithium fluoride (LiF) was deposited by evaporation to a thickness of 1 nm, so that the electron-injection layer 115 was formed. Lastly, aluminum was deposited by evaporation to a thickness of 200 nm to form the second electrode 102 functioning as a cathode. Thus, the light-emitting element 1 in this example was fabricated.

(Method for Manufacturing Comparative Light-Emitting Element 1)

The comparative light-emitting element 1 was manufactured in the same manner as the light-emitting element 1 except for using bathophenanthroline (abbreviation: BPhen) represented by Structural Formula (xi) instead of NBPhen.

(Method for Manufacturing Light-Emitting Element 2)

The light-emitting element 2 was manufactured in the same manner as the light-emitting element 1 except for using tris(4-t-butyl-6-phenylpyrimidinato)iridium(III) (abbreviation: [Ir(tBuppm)$_3$]) represented by Structural Formula (vii) instead of [Ir(dmdppr-P)$_2$(dibm)], the thickness of ITSO serving as the first electrode 101 was set to 70 nm and the thickness of the layer 114n containing the condensed aromatic compound or the condensed heteroaromatic compound in the electron-transport layer 114 was set to 15 nm.

(Method for Manufacturing Comparative Light-Emitting Element 2)

The comparative light-emitting element 2 was manufactured in the same manner as the light-emitting element 1 except for using BPhen instead of NBPhen in the light-emitting element 2.

(Method for Manufacturing Light-Emitting Element 3)

The light-emitting element 3 was manufactured basically in the same manner as that of the light-emitting element 1; however, the thickness of the first electrode 101 was set to 70 nm and the hole-transport layer was formed by deposition of 3-[4-(9-phenanthryl)-phenyl]-9-phenyl-9H-carbazole (abbreviation: PCPPn) represented by Structural Formula (viii) to a thickness of 20 nm. The light-emitting layer was formed by deposition of 7-[4-(10-phenyl-9-anthryl)phenyl]-7H-dibenzo[c,g]carbazole (abbreviation: cgDBCzPA) represented by Structural Formula (ix) and N,N'-bis(dibenzofuran-4-yl)-N,N'-diphenylpyrene-1,6-diamine (abbreviation: 1,6FrAPrn-II) represented by Structural Formula (x) with a weight ratio of 1:0.05 (cgDBCzPA:1,6FrAPrn-II) to a thickness of 25 nm. As the electron-transport layer 114, the layer 114n containing the condensed aromatic compound or the condensed heteroaromatic compound was found using cgDBCzPA to a thickness of 5 nm, and the layer 114m containing NBPhen was formed to a thickness of 10 nm.

(Method for Manufacturing Comparative Light-Emitting Element 3)

The comparative light-emitting element 3 was manufactured in the same manner as the light-emitting element 1 except for using BPhen instead of NBPhen in the light-emitting element 3.

Note that in all the above evaporation steps, evaporation was performed by a resistance-heating method. Note that the light-emitting element 1 and the comparative light-emitting element 1 emit red phosphorescent light; the light-emitting element 2 and the comparative light-emitting element 2 emit green phosphorescent light; and the light-emitting element 3 and the comparative light-emitting element 3 emit blue fluorescent light. The layer 114n containing the condensed aromatic compound or the condensed heteroaromatic compound contains the condensed heteroaromatic compound in the light-emitting elements 1 and 2 and the comparative light-emitting elements 1 and 2, and contains the condensed aromatic compound in the light-emitting element 3 and the comparative light-emitting element 3.

The light-emitting elements 1 to 3 and the comparative light-emitting elements 1 to 3 were each sealed using a glass substrate in a glove box containing a nitrogen atmosphere so as not to be exposed to the air (specifically, a sealing material was applied onto an outer edge of the element and UV treatment and heat treatment at 80° C. for 1 hour were performed at the time of sealing). Then, reliability of these light-emitting elements was measured. Note that the measurements were carried out at room temperature (25° C.).

Figure 13:
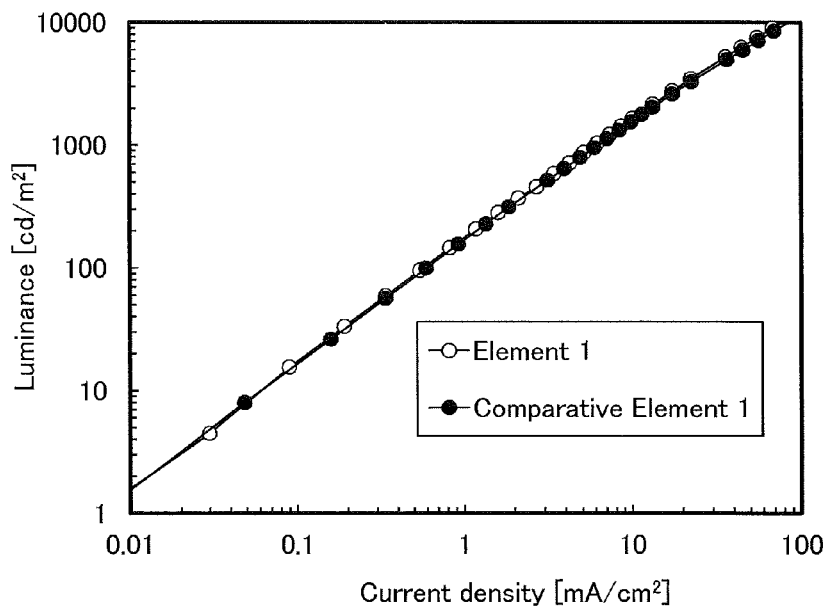
FIG. 13 shows current density-luminance characteristics of a light-emitting element 1 and a comparative light-emitting element 1.
Figure 14:
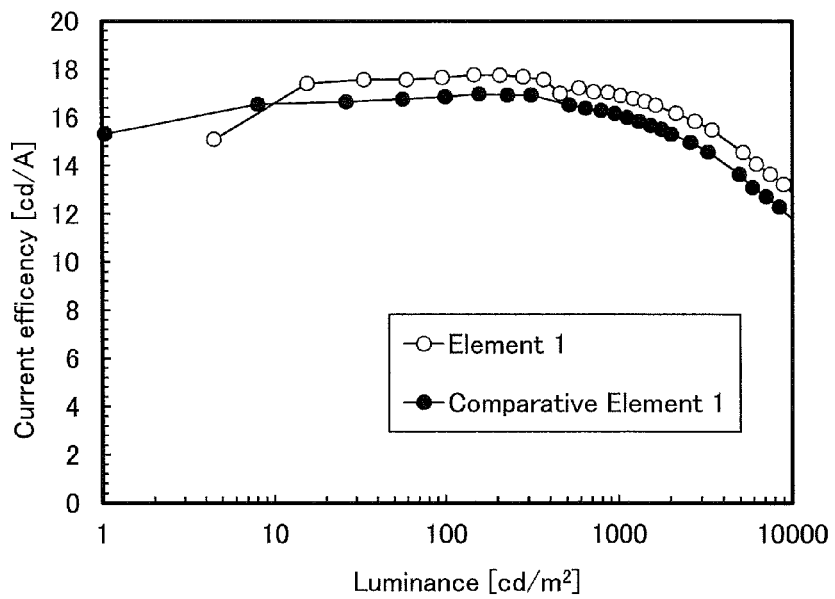
FIG. 14 shows luminance-current efficiency characteristics of the light-emitting element 1 and the comparative light-emitting element 1.
Figure 15:
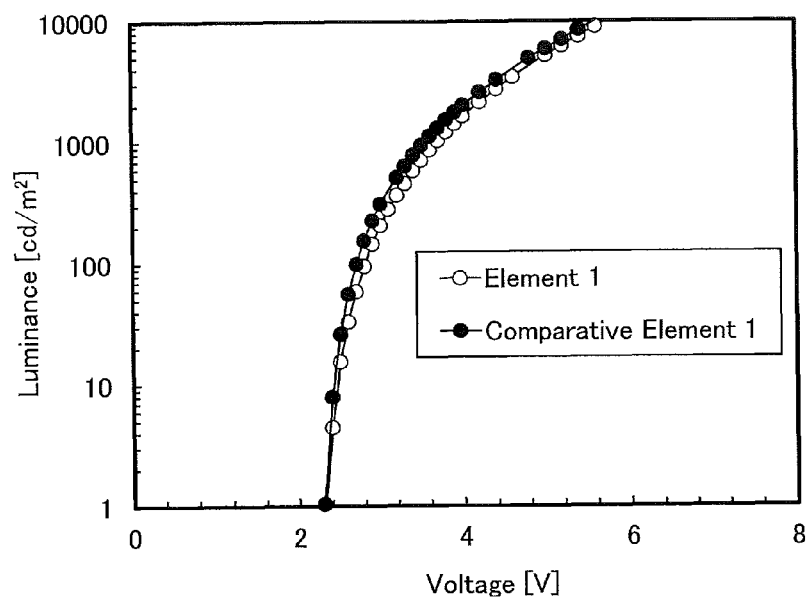
FIG. 15 shows voltage-luminance characteristics of the light-emitting element 1 and the comparative light-emitting element 1.
Figure 16:
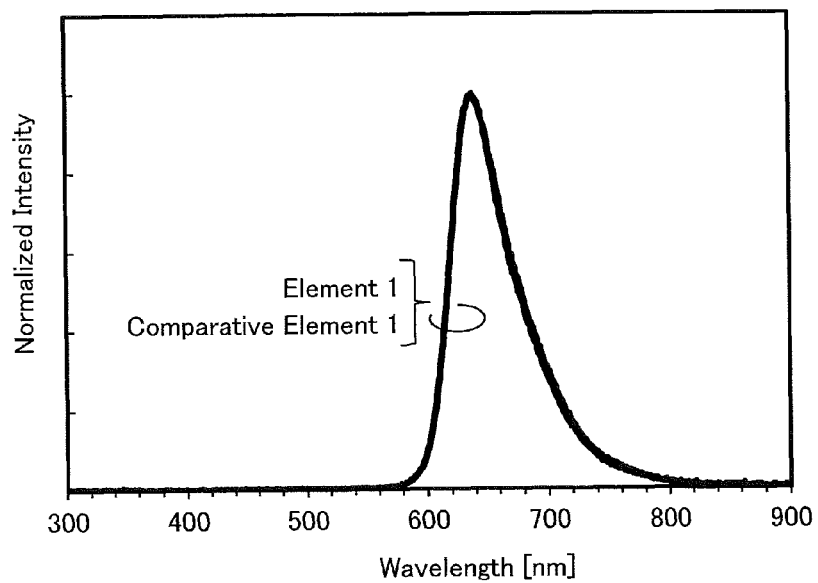
FIG. 16 shows emission spectra of the light-emitting element 1 and the comparative light-emitting element 1.
Figure 17:
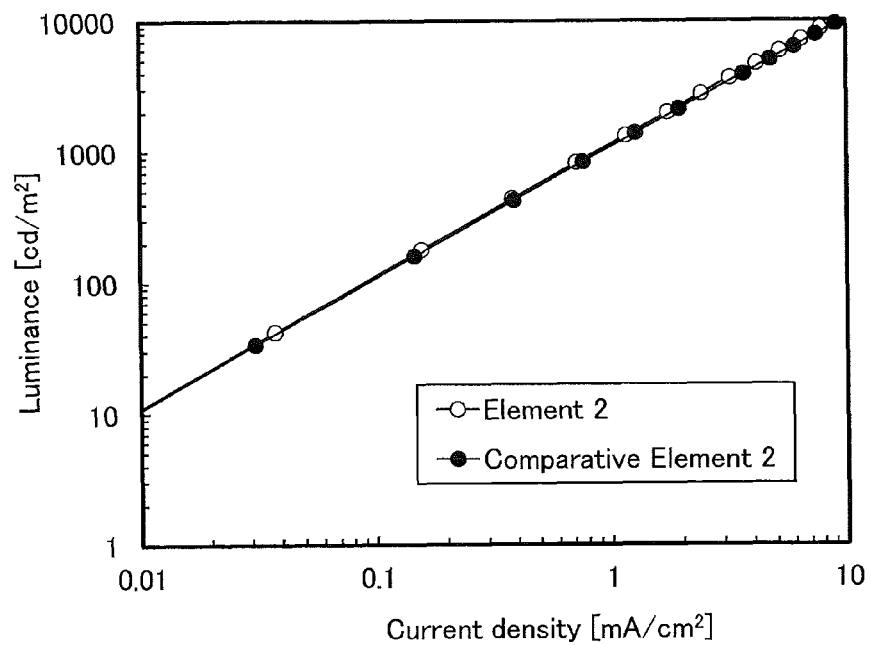
FIG. 17 shows current density-luminance characteristics of a light-emitting element 2 and a comparative light-emitting element 2.
Figure 18:
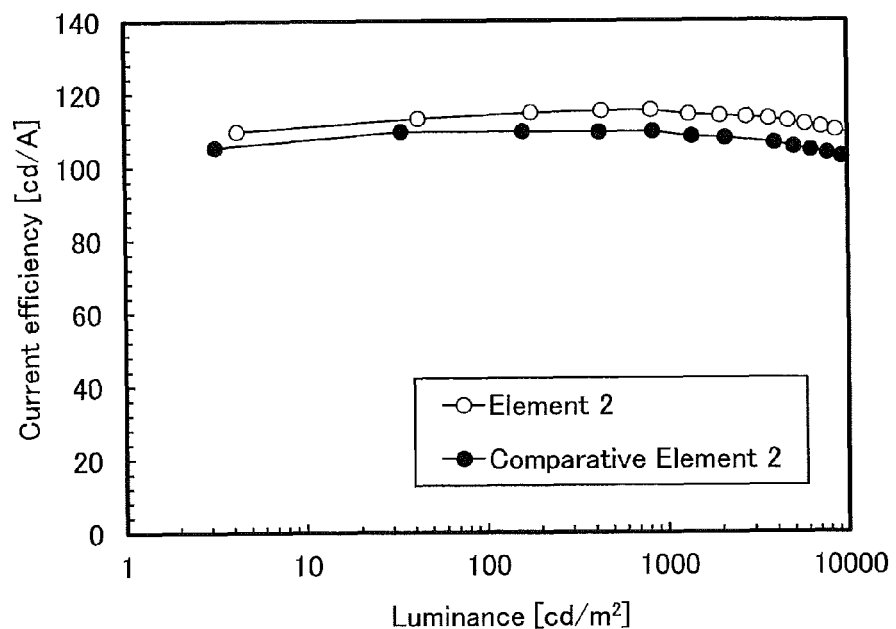
FIG. 18 shows luminance-current efficiency characteristics of the light-emitting element 2 and the comparative light-emitting element 2.
Figure 19:
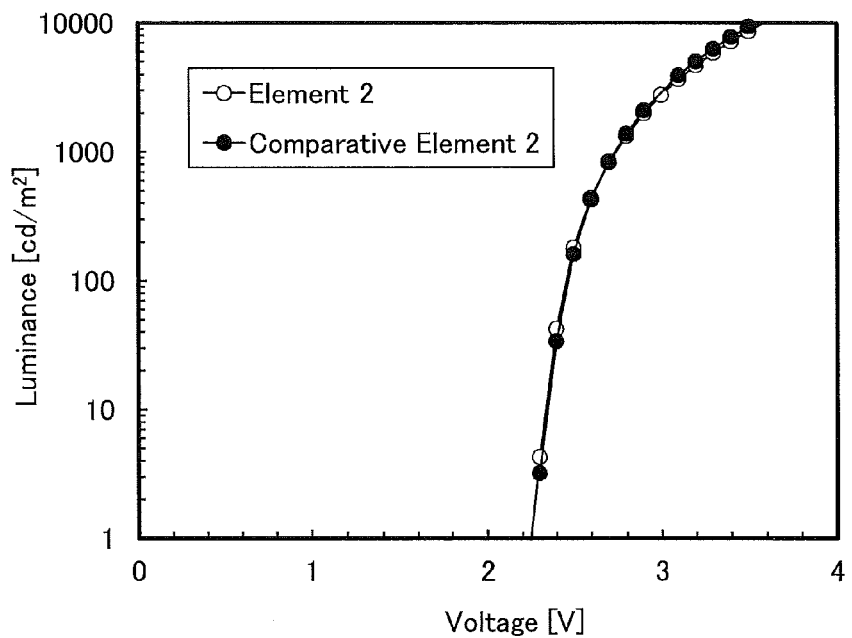
FIG. 19 shows voltage-luminance characteristics of the light-emitting element 2 and the comparative light-emitting element 2.
Figure 20:
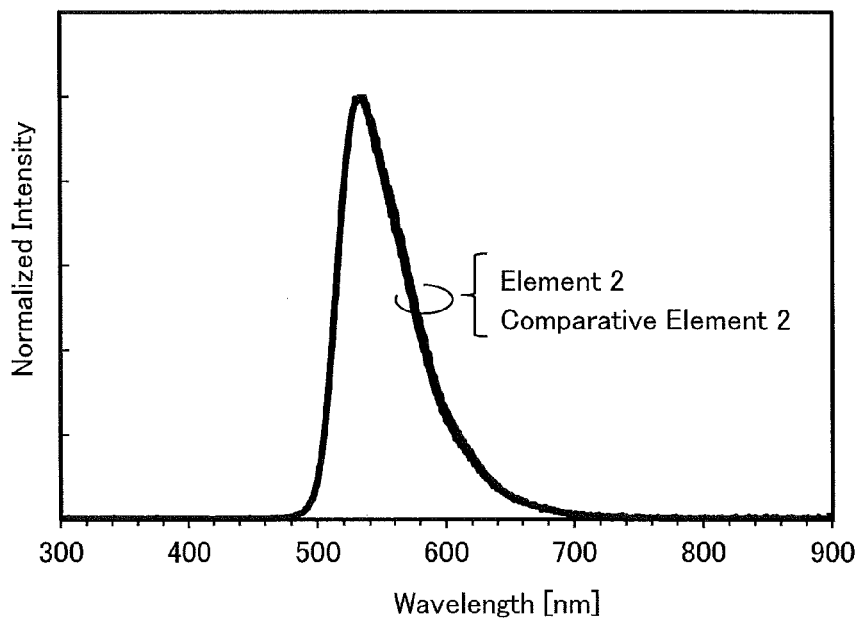
FIG. 20 shows emission spectra of the light-emitting element 2 and the comparative light-emitting element 2.
Figure 21:
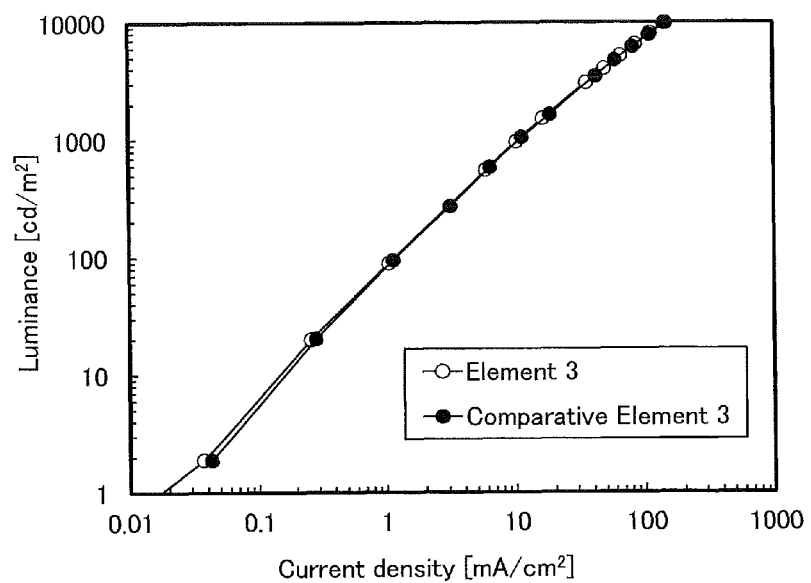
FIG. 21 shows current density-luminance characteristics of a light-emitting element 3 and a comparative light-emitting element 3.
Figure 22:
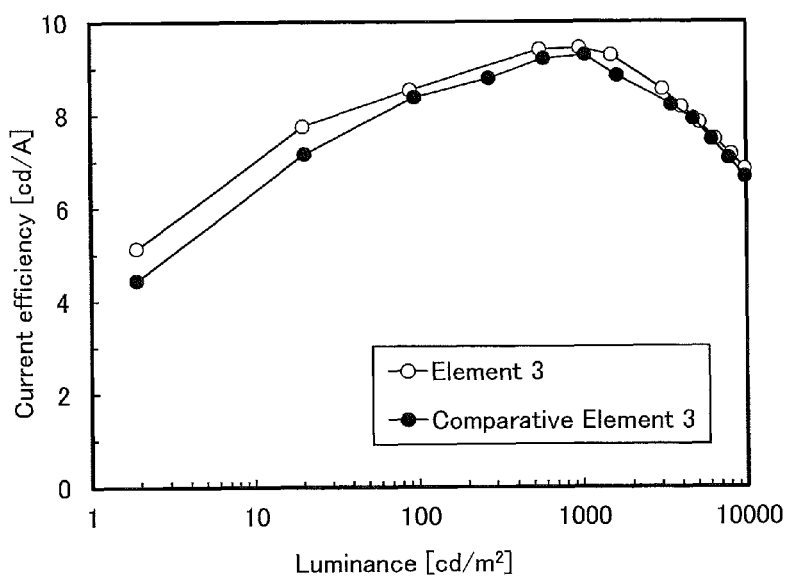
FIG. 22 shows luminance-current efficiency characteristics of the light-emitting element 3 and the comparative light-emitting element 3.
Figure 23:
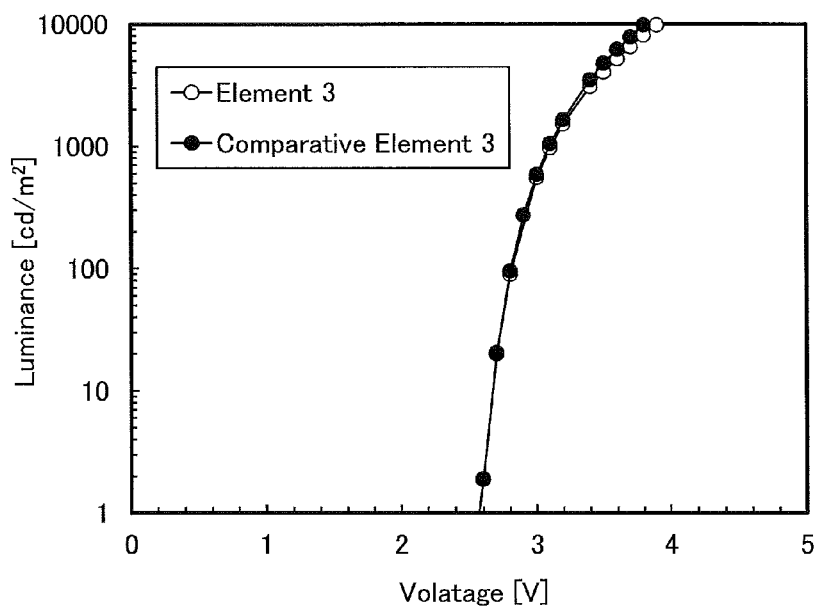
FIG. 23 shows voltage-luminance characteristics of the light-emitting element 3 and the comparative light-emitting element 3.
Figure 24:
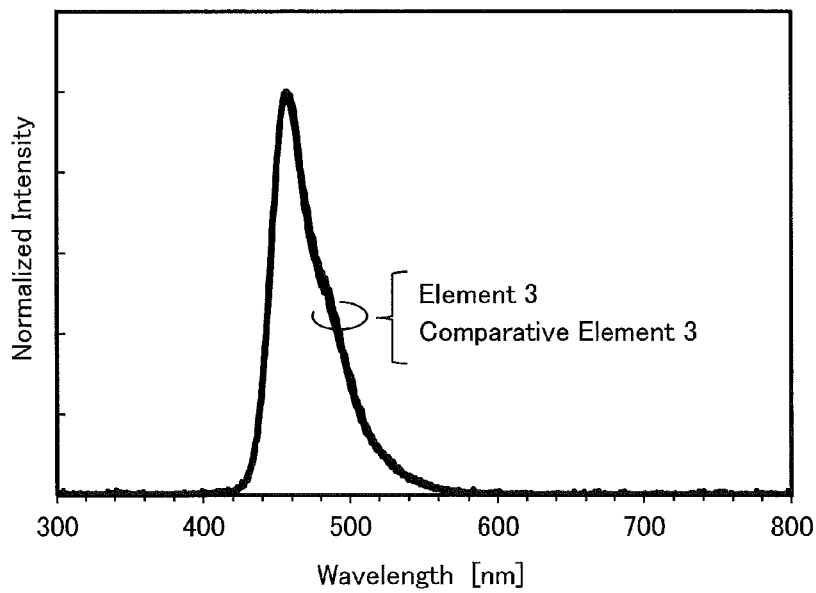
FIG. 24 shows emission spectra of the light-emitting element 3 and the comparative light-emitting element 3.

FIG. 13 shows current density-luminance characteristics of the light-emitting element 1 and the comparative light-emitting element 1; FIG. 14 shows luminance-current efficiency characteristics thereof; FIG. 15 shows voltage-luminance characteristics thereof; and FIG. 16 shows emission spectra thereof. FIG. 17 shows current density-luminance characteristics of the light-emitting element 2 and the comparative light-emitting element 2; FIG. 18 shows luminance-current efficiency characteristics thereof; FIG. 19 shows voltage-luminance characteristics thereof; and FIG. 20 shows emission spectra thereof. FIG. 21 shows current density-luminance characteristics of the light-emitting element 3 and the comparative light-emitting element 3; FIG. 22 shows luminance-current efficiency characteristics thereof; FIG. 23 shows voltage-luminance characteristics thereof; and FIG. 24 shows emission spectra thereof.

The results show that both the light-emitting elements and the comparative light-emitting elements exhibit very favorable initial characteristics.

Then, these light-emitting elements were subjected to heat resistance tests. First, current values were measured when these elements were made to emit light at 1000 cd/cm². Using the current values, luminances and drive voltages were further measured. Next, each element was kept in a constant temperature bath at 85° C. and taken out after a predetermined time. After the element was sufficiently cooled down, the element was made to emit light at room temperature using the initially measured current value, and the luminance and the drive voltage were measured. Results are shown in FIGS. 25A and 25B and FIGS. 26A and 26B.

Figure 25A:
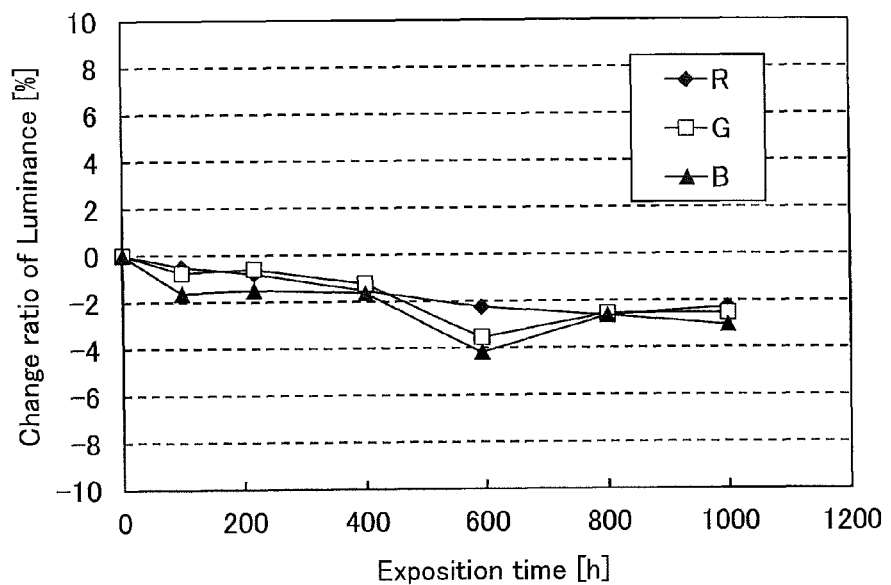
FIGS. 25A and 25B show high-temperature exposition test results (luminance changes) of the light-emitting elements 1 to 3 and the comparative light-emitting elements 1 to 3.
Figure 25B:
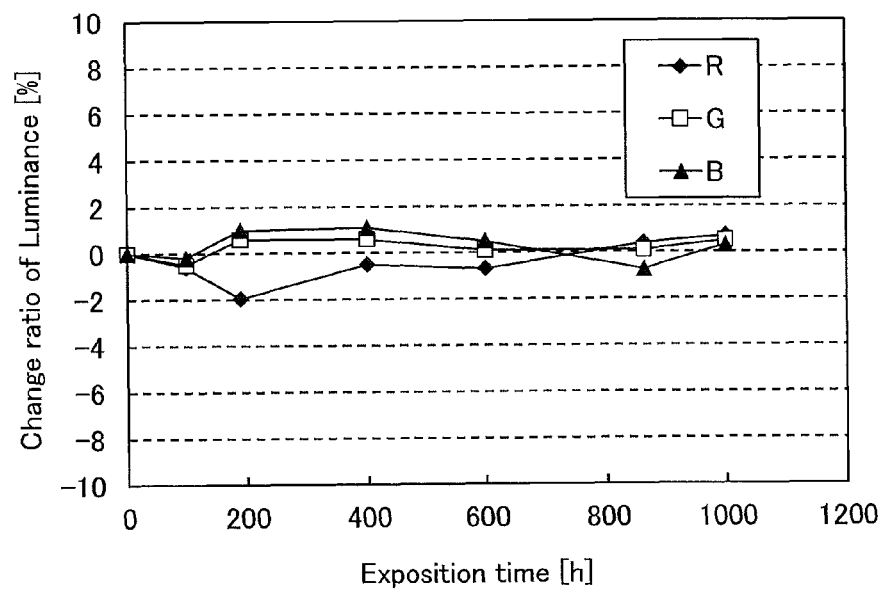

FIGS. 25A and 25B are graphs showing heat exposition time in the constant temperature bath and luminance changes. FIG. 25A shows results of the comparative light-emitting elements 1 to 3, and FIG. 25B shows results of the light-emitting elements 1 to 3. These graphs indicate that as the length of time of heat exposition of the comparative light-emitting elements 1 to 3 at 85° C. increases, the emission intensities thereof decrease when the same current is made to flow. On the other hand, the light-emitting elements 1 to 3 do not show a luminance decrease.

Figure 26A:
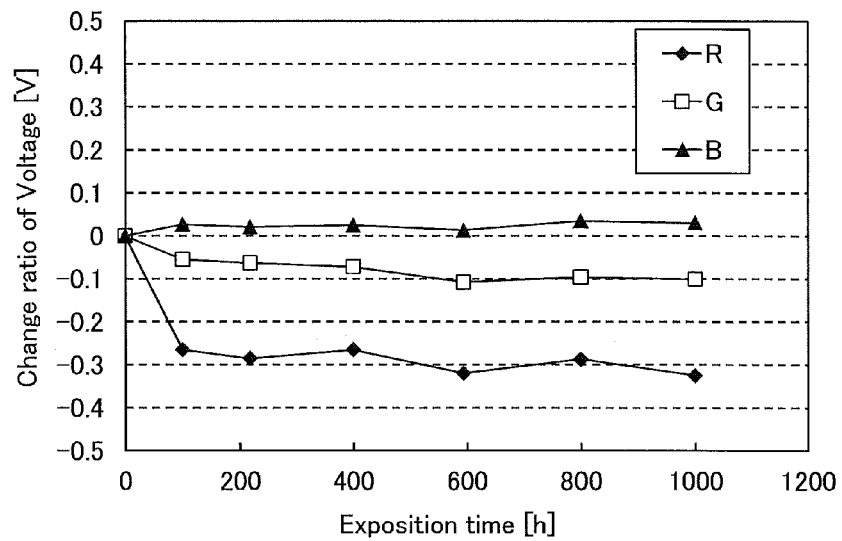
FIGS. 26A and 26B show high-temperature exposition test results (voltage changes) of the light-emitting elements 1 to 3 and the comparative light-emitting elements 1 to 3.
Figure 26B:
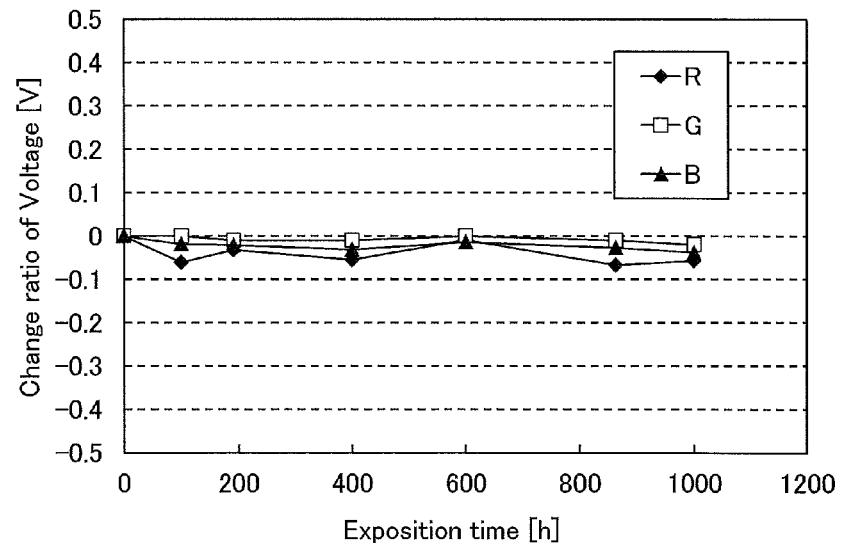

FIGS. 26A and 26B are graphs showing heat exposition time in the constant temperature bath and voltage changes. FIG. 26A shows results of the comparative light-emitting elements 1 to 3, and FIG. 26B shows results of the light-emitting elements 1 to 3. FIG. 26A indicates that the light-emitting element 3 and the comparative light-emitting element 3 in which the layer 114n containing the condensed aromatic compound or the condensed heteroaromatic compound contains the condensed aromatic compound show little change in voltage with respect to heat exposition time at 85° C. On the other hand, FIG. 26B indicates that the comparative light-emitting elements 1 and 2 in which the layer 114n containing the condensed aromatic compound or the condensed heteroaromatic compound contains the condensed heteroaromatic compound show significant changes in voltage due to high-temperature exposition. However, it also indicates that the light-emitting elements 1 and 2 in which the layer containing NBPhen is provided in contact with the layer 114n containing the condensed aromatic compound or the condensed heteroaromatic compound show little change in voltage.

As described above, the light-emitting elements and the comparative light-emitting elements have similarly favorable initial characteristics, but show a great difference as a result of high-temperature exposition. An important point here is that their initial characteristics are favorable and show little change. In accordance with one embodiment of the present invention, a light-emitting element with improved reliability at high temperature as well as with maintained performance as a light-emitting element can be obtained.

Example 2

In this example, light-emitting elements (light-emitting elements 4 to 6) of one embodiment of the present invention will be described. Structural formulae of organic compounds used in the light-emitting elements 4 to 6 are shown below.

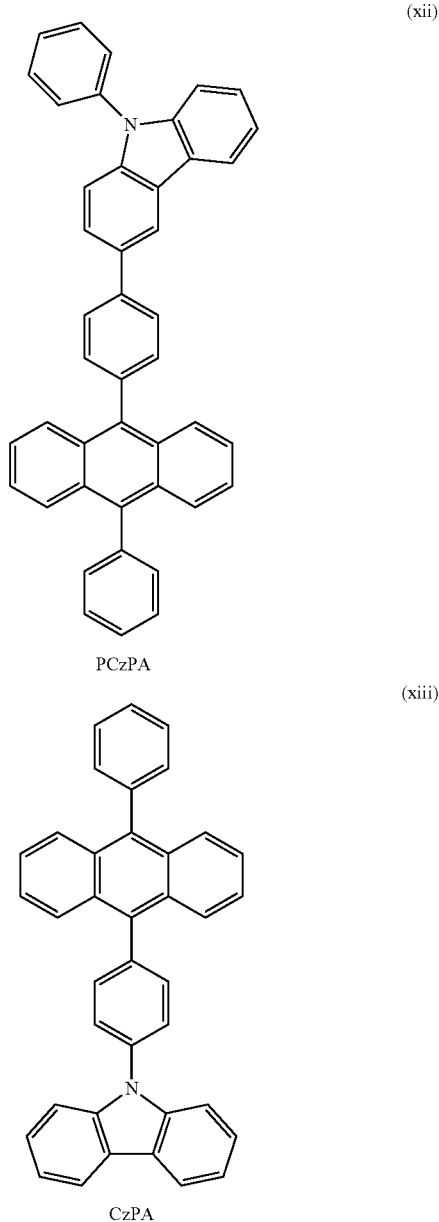 [SMILES: c1ccc(-c2c3ccccc3c(-c3ccc(-c4ccc5c(c4)c4ccccc4n5-c4ccccc4)cc3)c3ccccc23)cc1 ; c1ccc(-c2c3ccccc3c(-c3ccc(-n4c5ccccc5c5ccccc54)cc3)c3ccccc23)cc1]

(xii) PCzPA (xiii) CzPA (xiv)

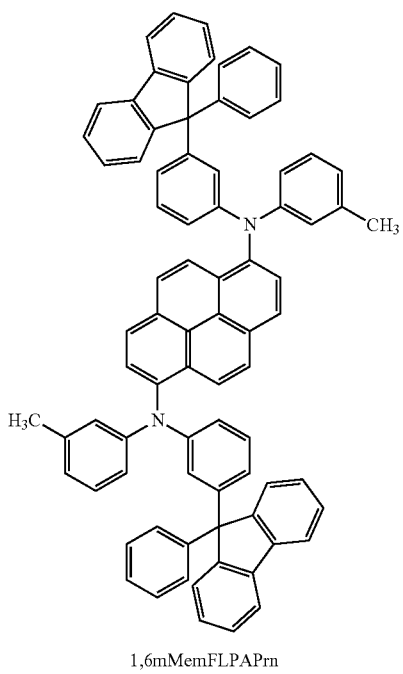

1,6mMemFLPAPrn (vi)

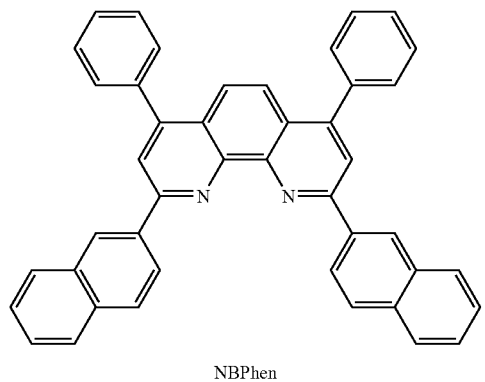

NBPhen

Methods for manufacturing the light-emitting elements 4 to 6 of this example will be described below.

(Method for Manufacturing Light-Emitting Elements 4 to 6)

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 functions as an anode of the light-emitting element.

Next, as pretreatment for forming the light-emitting element over the substrate, UV-ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 9-phenyl-3-[4-(10-phenyl-9-anthryl)phenyl]-9H-carbazole (abbreviation: PCzPA) represented by Structural Formula (xii) and molybdenum(VI) oxide were deposited by co-evaporation by an evaporation method using resistance heating, so that the hole-injection layer 111 was formed. The thickness of the hole-injection layer 111 was set to 50 nm, and the weight ratio of PCzPA to molybdenum oxide was adjusted to 4:2 (=PCzPA:molybdenum oxide).

Next, a film of PCzPA was formed to a thickness of 10 nm over the hole-injection layer 111 to form the hole-transport layer 112.

Further, over the hole-transport layer 112, the light-emitting layer 113 was formed by co-evaporation of 9-[4-(10-phenyl-9-anthryl)phenyl]-9H-carbazole (abbreviation: CzPA) represented by Structural Formula (xiii) and N,N'-bis(3-methylphenyl)-N,N'-bis[3-(9-phenyl-9H-fluoren-9-yl)phenyl]-pyrene-1,6-diamine (abbreviation: 1,6mMemFL-PAPm) represented by Structural Formula (xiv) with a weight ratio of 1:0.04 (=CzPA:1,6mMemFLPAPrn) to a thickness of 25 nm.

Then, the electron-transport layer 114 was formed over the light-emitting layer 113 in such a manner that a 10 nm thick film of CzPA was formed (the layer 114n containing the condensed aromatic compound or the condensed heteroaromatic compound) and a 15 nm thick film of 2,9-bis(naphthalen-2-yl)-4,7-diphenyl-1,10-phenanthroline (abbreviation: NBPhen) represented by Structural Formula (vi) was formed (the layer containing NBPhen).

After the formation of the electron-transport layer 114, lithium fluoride (LiF) was deposited by evaporation to a thickness of 1 nm, so that the electron-injection layer 115 was formed. Lastly, aluminum was deposited by evaporation to a thickness of 200 nm to form the second electrode 102 functioning as a cathode. Thus, the light-emitting elements 4 to 6 in this example were manufactured.

The light-emitting elements 4 to 6 were each sealed using a glass substrate in a glove box containing a nitrogen atmosphere so as not to be exposed to the air (specifically, a sealing material was applied onto an outer edge of the element and UV treatment and heat treatment at 80° C. for 1 hour were performed at the time of sealing). Then, reliability of these light-emitting elements was measured. Note that the measurements were carried out at room temperature (25° C.).

Figure 27:
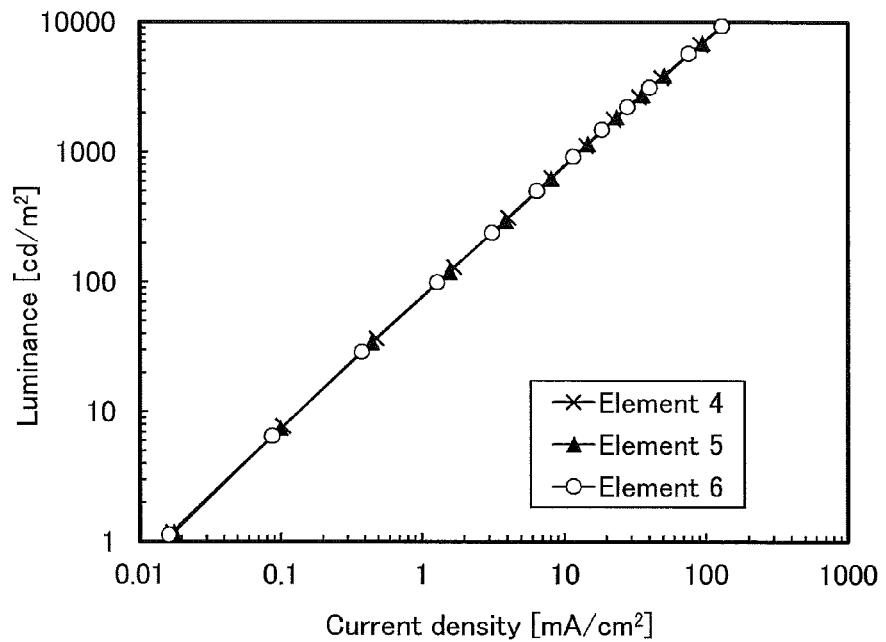
FIG. 27 shows current density-luminance characteristic of light-emitting elements 4 to 6.
Figure 28:
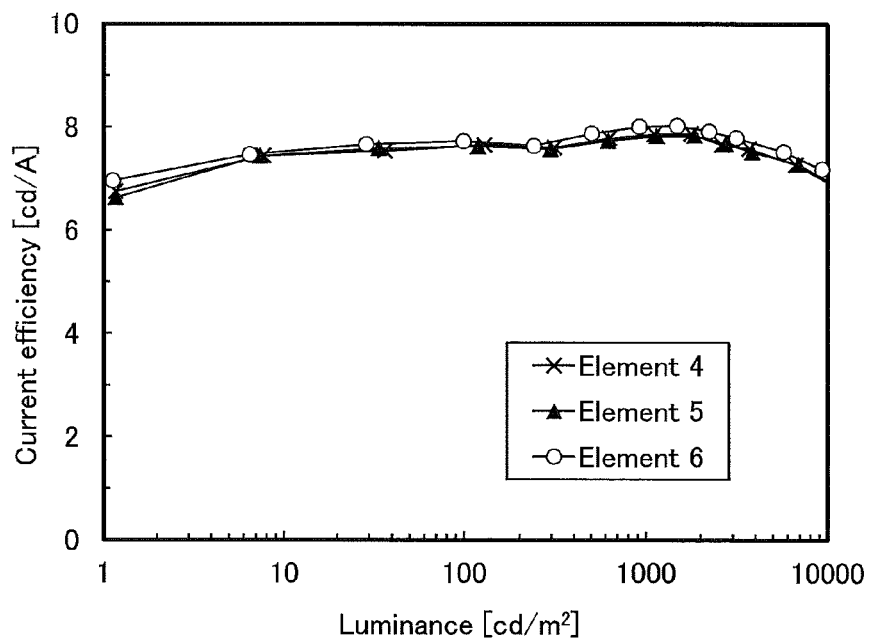
FIG. 28 shows luminance-current efficiency characteristics of the light-emitting elements 4 to 6.
Figure 29:
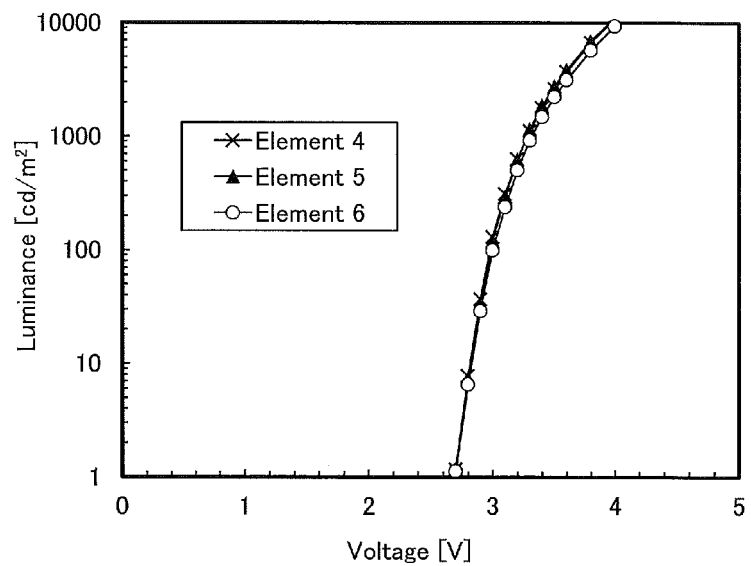
FIG. 29 shows voltage-luminance characteristics of the light-emitting elements 4 to 6.
Figure 30:
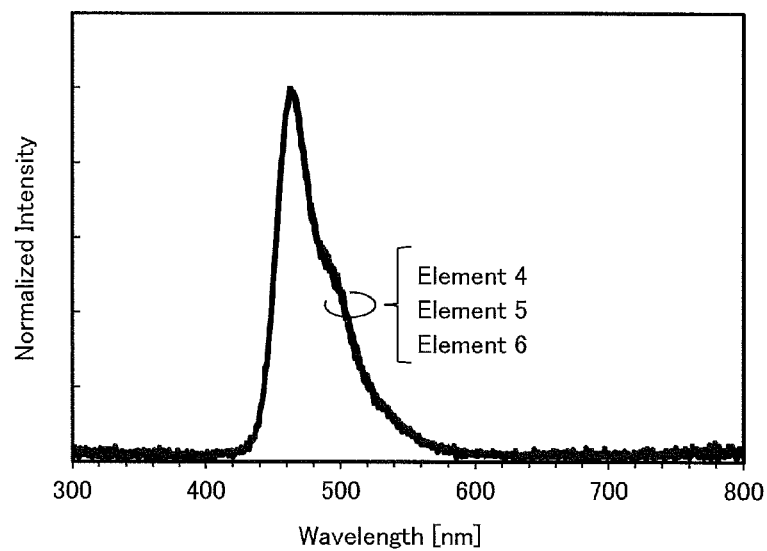
FIG. 30 shows emission spectra of the light-emitting elements 4 to 6.

FIG. 27 shows current density-luminance characteristics of the light-emitting elements 4 to 6; FIG. 28 shows luminance-current efficiency characteristics thereof; FIG. 29 shows voltage-luminance characteristics thereof; and FIG. 30 shows emission spectra thereof.

The results show that the light-emitting elements exhibit very favorable initial characteristics.

Figure 31:
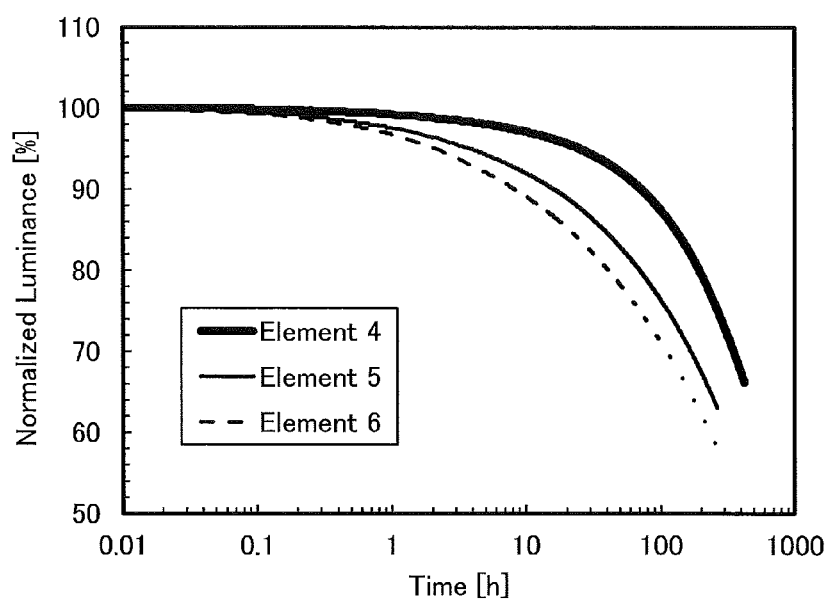
FIG. 31 shows time dependence of normalized luminance of the light-emitting elements 4 to 6.

FIG. 31 shows measurement results of luminance changes with respect to driving time under constant current density conditions at an initial luminance of 5000 cd/m². It is found from FIG. 31 that, although each element shows favorable characteristics, the light-emitting element 5 shows more favorable characteristics than the light-emitting element 6 and the light-emitting element 4 shows more favorable characteristics than the light-emitting element 5.

Here, as NBPhen used in the layer containing NBPhen, materials with different impurity concentrations (samples 1 to 3) are used in the light-emitting elements 4 to 6, and the samples 1 to 3 were used in the light-emitting elements 4 to 6, respectively.

Impurities in NBPhen were detected using the following detectors: ACQUITY UPLC by Waters Corporation, Xevo G2 T of MS by Waters Corporation, and ACQUITY UPLC PDA eλ by Waters Corporation.

In analysis, a solution obtained by dissolution of 1 mg of each sample in 2 mL of chloroform and then dilution with acetonitrile 10-fold was used as a measurement sample. The analysis was carried out at 40° C. using ACQUITY UPLC BEH C8 Column by Waters Corporation (particle diameter: 1.7 μm, 100 mm×2.1 mm) as a column, under the conditions where Mobile Phase A was acetonitrile and Mobile Phase B was a 0.1% formic acid aqueous solution, in a gradient manner in which the proportion of Mobile Phase A was increased at a flow rate of 0.5 mL/min to reach 65%, held for 1 minute, and then increased at a constant rate to reach 95% 10 minutes later. The injection amount was 5 μL.

Figure 32:
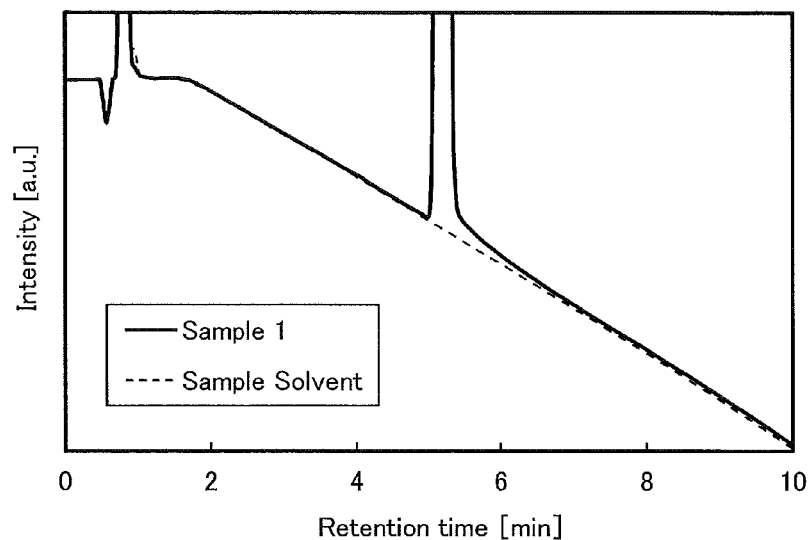
FIG. 32 shows a UPLC chromatogram of a sample 1.
Figure 33:
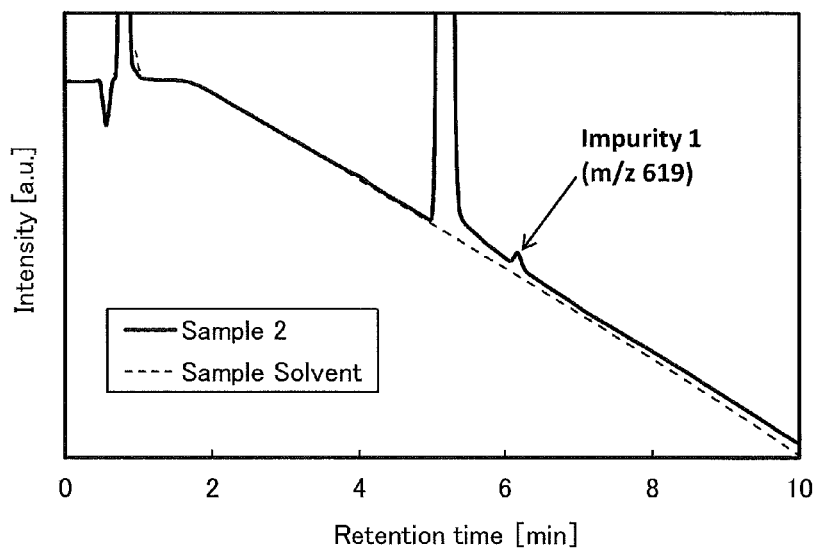
FIG. 33 shows a UPLC chromatogram of a sample 2.
Figure 34:
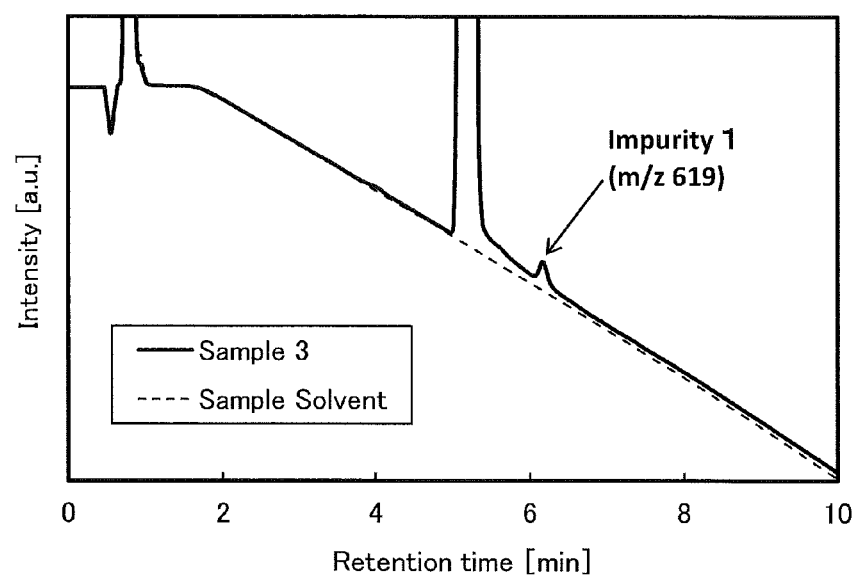
FIG. 34 shows a UPLC chromatogram of a sample 3.

FIGS. 32 to 34 show chromatograms obtained by measurement (detector: photodiode array (PDA) (absorption wavelength: 210 nm to 500 nm)). Note that FIG. 32 shows a measurement result of NBPhen used in the light-emitting element 4 (the sample 1); FIG. 33 shows a measurement result of NBPhen used in the light-emitting element 5 (the sample 2); and FIG. 34 shows a measurement result of NBPhen used in the light-emitting element 6 (the sample 3). Note that in each of FIGS. 32 to 34, the horizontal axis represents time (min) and the vertical axis represents intensity (arbitrary unit). The content percentage of an impurity in each sample was obtained by calculating a peak area from the chromatogram. In the calculation of the peak area, a peak detected within one minute was excluded because the peak resulted from chloroform used for dissolving the material. In addition, a mass spectrum was calculated for each peak.

In the MS analysis, ionization was carried out by an electrospray ionization (ESI) method. Capillary voltage and sample cone voltage were set to 3.0 kV and 30 V, respectively. Detection was performed in a positive mode.

Figure 35:
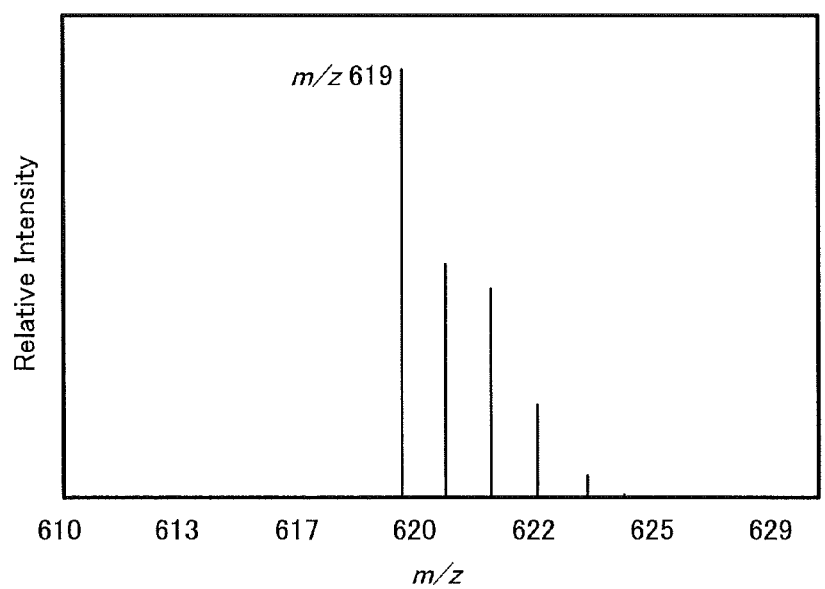
FIG. 35 shows a mass spectrum of an impurity 1.

Among substances detected with the PDA, m/z=585 is attributable to NBPhen. It can be inferred from the mass spectrum in FIG. 35 that an impurity 1 (m/z=619) is a chlorine mono-substituted compound of NBPhen which is represented by the following structure formula, though the substitution site is unspecified.

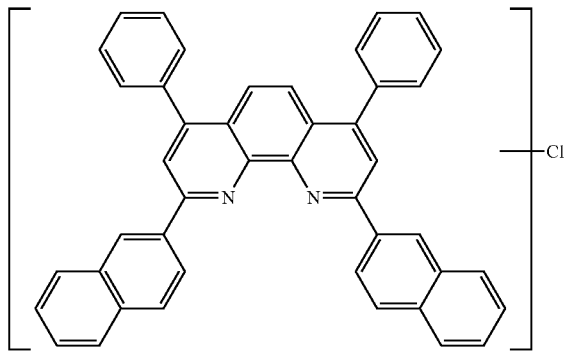

The analysis results show that the proportion of the peak at m/z=619 which can be considered to be an impurity is 0.00% in the sample 1, 0.22% in the sample 2, and 0.29% in the sample 3.

Furthermore, the amount of chlorine was measured by combustion ion chromatography. The analysis was carried out using an automatic sample combustion apparatus AQF-2100H by Mitsubishi Chemical Analytech Co., Ltd. and an ion chromatography system Dionex ICS-2100 by Thermo Fisher Scientific Inc.

Approximately 13 mg of each sample was weighed and put in a ceramic boat as a combustion sample. The heater temperature in the combustion apparatus was 1000° C. on the entrance side and 900° C. on the exit side. Gases of Ar, $O_2$, and humidified Ar were kept flowing at flow rates of 200 mL/min, 400 mL/min, and 100 mL/min, respectively. An absorption solution (pure water to which 30 ppm of a phosphoric acid was added as an internal reference in the ion chromatography) was subjected to bubbling with those gases so as to absorb gases generated at the time of combustion.

Sample combustion was carried out in such a manner that a boat controller was used and the boat was moved under certain conditions so that the sample was reacted with oxygen at high temperature. The conditions for boat movement are as follows. Assuming that the sample setting position was 0 mm, the boat was moved to a position of 130 mm at 20 mm/sec and stopped for 90 sec. Then, the boat was moved to a position of 160 mm at 0.12 mm/sec and stopped for 90 sec. Lastly, the boat was moved to the end of a combustion tube, i.e., a position of 265 mm at 20 mm/sec, stopped for 90 sec, and then collected. The amount of chlorine was measured by introducing 100 μL of the absorption solution which had absorbed gases generated by the above combustion into the ion chromatograph.

Ion chromatography analysis was carried out at 35° C. using columns of Dionex IonPac AG20 (4 mm×50 mm) and Dionex IonPac AS20 (4 mm×250 mm) KOH was used as an eluent and its flow rate was set to 1.0 mL/min. Gradient measurement was carried out in which the concentration of KOH was increased from 10 mmol/L to reach 15 mmol/L after 7 min and 40 mmol/L after 18 min.

A conductivity detector was used as the detector. A calibration curve was created using an anion mixed reference solution purchased from Kanto Chemical Co., Inc.

Analysis results show that the amount of chlorine in the sample 1 is 13.5 ppm, the amount of chlorine in the sample 2 is 114.5 ppm, and the amount of chlorine in the sample 3 is 159.2 ppm. These results and UPLC results of impurity content percentages are listed in Table 1.

TABLE 1

| NBPhen Lot No. | F ppm (mg/L) | Cl ppm | Br ppm | S ppm | UPLC Proportion of +Cl |
|---|---|---|---|---|---|
| Sample 1 | 0.4 | 13.5 | ND | 3.2 | 0.00% |
| Sample 2 | 0.5 | 114.5 | ND | 1.7 | 0.22% |
| Sample 3 | 0.4 | 159.2 | 0.8 | 1.4 | 0.29% |

ND: Not Detected

The data of the light-emitting elements 4 to 6 described above also show that a light-emitting element containing a smaller amount of NBPhen derivatives mono-substituted by chlorine has higher reliability. These results suggest that, with the use of a material in which the amount of chlorine in NBPhen is 100 ppm or less for a light-emitting element, deterioration of the light-emitting element can be minimized, so that a highly reliable light-emitting element can be obtained. Meanwhile, this impurity concentration is equivalent to $1.0 \times 10^{-2}$ g/kg as the chlorine concentration in NBPhen solid, and $1.7 \times 10^{-1}$ g/kg as the concentration of the chlorine mono-substituted compound in NBPhen solid.

This application is based on Japanese Patent Application serial no. 2013-166870 filed with Japan Patent Office on Aug. 9, 2013 and Japanese Patent Application serial no. 2013-

269839 filed with Japan Patent Office on Dec. 26, 2013, the entire contents of which are hereby incorporated by reference.

What is claimed is:

1. A light-emitting element comprising:
a first electrode;
a second electrode; and
an EL layer between the first electrode and the second electrode, the EL layer comprising:
   a first layer comprising one of a condensed aromatic compound and a condensed heteroaromatic compound; and
   a second layer comprising NBPhen, the second layer in contact with the first layer,
wherein the condensed heteroaromatic compound is different from NBPhen.

2. The light-emitting element according to claim 1,
wherein the condensed heteroaromatic compound comprises a condensed ring skeleton, and
wherein the condensed ring skeleton includes two nitrogen atoms.

3. The light-emitting element according to claim 1, wherein the light-emitting element is capable of emitting phosphorescent light.

4. The light-emitting element according to claim 1, wherein the first layer further comprises an iridium complex.

5. The light-emitting element according to claim 1, wherein a part of the first layer comprises an iridium complex.

6. The light-emitting element according to claim 1, wherein the second layer comprises chlorine at $1.0 \times 10^{-2}$ g/kg or less.

7. The light-emitting element according to claim 1,
wherein the second layer comprises an impurity at $1.7 \times 10^{-1}$ g/kg or less, and
wherein the impurity is a chlorine mono-substituted derivative of NBPhen.

8. A light-emitting device comprising:
the light-emitting element according to claim 1; and
a unit for controlling the light-emitting element.

9. A lighting device comprising:
the light-emitting element according to claim 1; and
a unit for controlling the light-emitting element.

10. An electronic device comprising the light-emitting element according to claim 1.

11. A light-emitting element comprising:
a first electrode;
a second electrode; and
an EL layer between the first electrode and the second electrode, the EL layer comprising:
   a first layer comprising one of a condensed aromatic compound and a condensed heteroaromatic compound; and
   a second layer comprising NBPhen, the second layer in contact with the first layer,
wherein each of the condensed aromatic compound and the condensed heteroaromatic compound comprises a condensed ring skeleton including three or more rings, and
wherein the condensed heteroaromatic compound is different from NBPhen.

12. The light-emitting element according to claim 11, wherein the condensed ring skeleton includes two nitrogen atoms.

13. The light-emitting element according to claim 11, wherein the light-emitting element is capable of emitting phosphorescent light.

14. The light-emitting element according to claim 11, wherein the first layer further comprises an iridium complex.

15. The light-emitting element according to claim 11, wherein a part of the first layer comprises an iridium complex.

16. The light-emitting element according to claim 11, wherein the second layer comprises chlorine at $1.0 \times 10^{-2}$ g/kg or less.

17. The light-emitting element according to claim 11,
wherein the second layer comprises an impurity at $1.7 \times 10^{-1}$ g/kg or less, and
wherein the impurity is a chlorine mono-substituted derivative of NBPhen.

18. A light-emitting device comprising:
the light-emitting element according to claim 11; and
a unit for controlling the light-emitting element.

19. A lighting device comprising:
the light-emitting element according to claim 11; and
a unit for controlling the light-emitting element.

20. An electronic device comprising the light-emitting element according to claim 11.

* * * * *